United States Patent [19]

Mitsui

[11] Patent Number: 5,480,838
[45] Date of Patent: Jan. 2, 1996

[54] METHOD OF MANUFACTURING A SEMICONDUCTOR DEVICE HAVING VERTICAL TRANSISTOR WITH TUBULAR DOUBLE-GATE

[75] Inventor: Katsuyoshi Mitsui, Hyogo, Japan

[73] Assignee: Mitsubishi Denki Kabushiki Kaisha, Tokyo, Japan

[21] Appl. No.: 334,083

[22] Filed: Nov. 4, 1994

Related U.S. Application Data

[62] Division of Ser. No. 69,036, May 28, 1993, Pat. No. 5,382,816.

[30] Foreign Application Priority Data

Jul. 3, 1992 [JP] Japan ..................... 4-176791

[51] Int. Cl.$^6$ .................... H01L 21/265; H01L 21/44; H01L 21/48
[52] U.S. Cl. ................ 437/203; 437/41; 437/915
[58] Field of Search ................... 257/265, 266, 257/302, 329, 330, 331, 332, 365, 401; 437/41, 203, 915

[56] References Cited

U.S. PATENT DOCUMENTS

| | | | |
|---|---|---|---|
| 4,290,078 | 9/1981 | Ronen | 257/401 |
| 4,975,754 | 12/1990 | Ishiuchi et al. | |
| 5,122,848 | 6/1992 | Lee et al. | |
| 5,158,901 | 10/1992 | Kosa et al. | |
| 5,244,824 | 9/1993 | Sivan | |
| 5,250,830 | 10/1993 | Yagishita et al. | |

FOREIGN PATENT DOCUMENTS

| | | |
|---|---|---|
| 63-72150 | 4/1988 | Japan |
| 2-135777 | 5/1990 | Japan |
| 2-309671 | 12/1990 | Japan |
| 3-187272 | 8/1991 | Japan |
| 3-218679 | 9/1991 | Japan |
| 4-99373 | 3/1992 | Japan |

OTHER PUBLICATIONS

"A Surrounding Gate Transistor (SGT) Cell for 64/256M bit DRAMs", by K. Sunouchi et al., IDEM 89, Technical Digest, pp. 23–26.
"High Performance CMOS Surrounding Gate Transistor (SGT) for Ultra High Density LSIs", by H. Takato et al., IEDM 88 Technical Digest, pp. 222–225.
"Threshold Voltage of Thin–Film Silicon–on–Insulator (SOI) MOSFET's", by Hyung–Kyu Lim et al., IEEE Transactions on Electron Devices, vol. ED–30, No. 10, Oct. 1983, pp. 1244–1251.
"Physics of Semiconductor Devices Second Edition", by S. M. Sze, pp. 362–397.
"High Performance Characteristics in Trench Dual–Gate MOSFET (TDMOS)", by Tomohisa Mizuno et al., Transactions on Electron Devices, vol. 38, No. 9, Sep. 1991, pp. 2121–2127.

*Primary Examiner*—Olik Chaudhuri
*Assistant Examiner*—Brian K. Dutton
*Attorney, Agent, or Firm*—Lowe, Price, LeBlanc & Becker

[57] ABSTRACT

A semiconductor device allowing control of its threshold voltage without requiring change in the materials of its gate electrodes and suitable for high density integration is disclosed. The semiconductor device includes a p type monocrystalline silicon substrate 1 having a cylindrical portion with inner and outer surfaces and extending in a vertical direction. A first gate electrode 8 and a second gate electrode 10 are disposed at the inner surface and the outer surface of the cylindrical portion 2, respectively. A source/drain region 5 is formed on the top end of the cylindrical portion 2, while a source/drain region 3 is formed on the inner bottom surface of the cylindrical portion 2. Therefore, the cylindrical portion 2 can be utilized as a channel region of an MIS field effect transistor. The threshold voltage of the transistor can easily be controlled by applying separate voltages to the two gate electrodes, the first electrode and the second electrode.

4 Claims, 33 Drawing Sheets

METHOD OF MANUFACTURING A SEMICONDUCTOR DEVICE HAVING VERTICAL TRANSISTOR WITH TUBULAR DOUBLE-GATE This application is a division of application Ser. No. 08/069,036 filed May 28, 1993 now U.S. Pat. No. 5,382,816.

BACKGROUND OF THE INVENTION

1. Field of the Invention

The present invention relates generally to semiconductor devices and manufacturing methods thereof, and more specifically, to a semiconductor device having a vertical field effect transistor and a manufacturing method thereof.

2. Description of the Background Art

Conventionally, SGTs (Surrounding Gate Transistors) are known as vertical field effect transistors. They are disclosed, for example, in an article entitled "High Performance CMOS Surrounding Gate Transistor (SGT) for Ultra High Density LSIs", IEDM88 Technical Digest, pp 222–225. FIG. 64 is a plan view showing a conventional SGT disclosed therein. FIG. 65 is a cross sectional view showing the SGT in FIG. 64 taken along line X—X. Referring to FIGS. 64 and 65, the conventional SGT includes a silicon substrate 301, a silicon pillar 301a formed in a prescribed region on the silicon substrate 301 and extending in a direction vertical to a main surface of the silicon substrate 301, a P well 302 formed on the main surface of the silicon substrate 301 and having a prescribed depth, a pair of n type source regions 303 formed in the part of the main surface of the silicon substrate adjacent to the silicon pillar 301a, an n type drain region 304 formed on the top end of the silicon pillar 301a, and a gate electrode 306 formed on the outer peripheral surface of the silicon pillar 301a with a gate oxide film 305 therebetween. The sidewalls of the silicon pillar 301a positioned between the source region 303 and the drain region 304 constitute the channel region of the SGT. More specifically, the channel length L of the SGT is defined by the height of the silicon pillar 301a, and the channel width of the SGT is defined by the outer peripheral length of the silicon pillar 301a. In this manner, in the conventional SGT, the sidewalls of the silicon pillar 301a can be used as the channel region, area occupied by the elements can be reduced as compared to a conventional planar type transistor. In other words, the SGT is an element suitable for high density integration.

The conventional SGT however suffers from the following disadvantage.

As the length t of the silicon pillar 301a in a direction along the main surface of the silicon substrate 301 shown in FIG. 65 is shortened with increase of the integration densities of devices, it will be difficult to control the threshold voltage of the SGT by channel doping. This phenomenon is described in detail, for example, in IEEE TRANSACTION OF ELECTRON, VOL. ED-30, No. 10, October 1983 CHAPTER III (pp. 1247–1250). As described above, in the conventional SGT, it will be difficult control its threshold voltage by channel doping with the sizes of elements being reduced, impeding accurate control of the threshold voltage as a result.

A conventional method of controlling the threshold voltage by changing the material of a gate electrode has been proposed. Such a method is disclosed in Physics of Semiconductor Devices SECOND EDITION by S. M. Sze pp. 363–397 (Table 3 (p. 396)). In this document, a proposed method controls the threshold voltage by using a gate electrode of Au or the like rather than a conventional gate electrode of polycrystalline silicon. According to this method, it is principly possible to control the threshold voltage.

However, Au used for the gate electrode can contaminate environment in a clean room free of heavy metals which is suitable for manufacturing silicon semiconductors. Furthermore, a gate electrode of Au is less suitable for mass production as compared to a gate electrode of polysilicon. On top of that, it is technically difficult to manufacture a gate electrode of Au or the like.

As described above, the conventional method of controlling the threshold voltage using a gate electrode formed of Au or the like is principly possible, but still encountered with various problems in practice. As a result, it has been difficult to accurately control the threshold voltage of an SGT in practice when the sizes of its elements are reduced.

SUMMARY OF THE INVENTION

It is an object of the invention to readily control a threshold voltage without changing the material of a gate electrode, in a semiconductor device.

Another object of the invention is to achieve high density integration in a semiconductor device.

A further object of the invention is to readily manufacture a semiconductor device allowing easy control of a threshold voltage without changing the material of a gate electrode, in a manufacturing method of a semiconductor device.

A semiconductor device, in one aspect of the invention, includes a semiconductor substrate of first type conductivity having a standing wall portion having inner and outer surfaces and extending to take a tubular shape, a first gate electrode of a tubular shape formed on the inner surface of the standing wall portion with a gate insulating film therebetween, a second gate electrode of a tubular shape formed on the outer surface of the standing wall portion with a second gate insulating film therebetween, first source/drain regions of second type conductivity formed on the top end of the standing wall portion, and second source/drain regions of the second type conductivity formed on the bottom surface of the semiconductor substrate surrounded by the inner surface of the standing wall portion.

The first gate electrode of tubular shape is formed on the inner surface of the standing wall of the semiconductor substrate of the first type conductivity extending in a tubular manner with the first gate insulating film therebetween, the second gate electrode of tubular shape is formed on the outer surface of the standing wall with the second gate insulating film therebetween, and, therefore, separate voltages can readily be applied to the first gate electrode and the second gate electrode. Accordingly, controlling voltages applied to the first gate electrode and the second gate electrode provides easy control of the threshold voltage without requiring change of the materials of the gate electrodes. Furthermore, since the semiconductor device is a vertical semiconductor device whose standing wall portion functions as a channel region, area occupied by its elements can be reduced as compared to conventional planar type semiconductor devices.

The semiconductor device, in another aspect of the invention, includes a semiconductor substrate of first type conductivity having a standing wall portion having inner and outer surfaces and extending in a tubular manner, a first gate electrode formed on the inner surface of the standing wall portion with a first gate insulating film therebetween, a second gate electrode formed on the outer surface of the standing wall portion with a second gate insluting film therebetween, first source/drain regions of second type conductivity formed on the top end of the standing wall portion, second source/drain regions of the second type conductivity formed on the bottom surface of the semiconductor substrate surrounded by the inner surface of the standing wall portion, a capacitor lower electrode electrically connected to the second source/drain regions, and a capacitor upper electrode formed on the capacitor lower electrode with a capacitor insulating film therebetween.

The first gate electrode is formed on the inner surface of the standing wall portion of the semiconductor substrate extending in a tubular manner with a first insulating film therebetween, the second gate electrode is formed on the outer surface of the standing wall portion with a second gate insulating film therebetween, and, therefore, controlling voltages applied to the first gate electrode and the second gate electrode at respective prescribed values provides easy control of the threshold voltages without requiring change of materials of the gate electrodes. Furthermore, since the standing wall portion functions as a channel region, thereby forming a vertical semiconductor device, area occupied by its elements can be reduced as compared to conventional planar type semiconductor devices. The second source/drain regions are formed on the bottom surface of the semiconductor substrate surrounded by the inner surface of the standing wall portion, the capacitor formed of the capacitor lower electrode, the capacitor insulating film and the capacitor upper electrode is electrically connected to the second source/drain regions, and, therefore, higher density integration can be achieved as compared to conventional planar type semiconductor devices including transistors and capacitors.

A method of manufacturing a semiconductor device, in a still further aspect of the invention, includes the steps of forming a standing wall portion having inner and outer surfaces extending in a tubular manner on a main surface of a semiconductor substrate of first type conductivity, forming a first gate electrode of a tubular shape on the inner surface of the standing wall portion with a first gate insulating film therebetween, a second gate electrode of a tubular shape on the outer surface of the standing wall portion with a second gate insulating film therebetween, forming first source/drain regions by implanting an impurity of second type conductivity to the top end of the standing wall portion, and forming second source/drain regions by implanting an impurity of the second type conductivity to the bottom surface of the semiconductor substrate surrounded by the inner surface of the standing wall.

The standing wall having inner and outer surfaces and extending in a tubular manner is formed on a main surface of the semiconductor substrate of the first type conductivity, the first gate electrode of a tubular shape is formed on the inner surface of the standing wall portion with the first gate insulating film therebetween, the second gate electrode of a tubular shape is formed on the outer surface of the standing wall portion with the second gate insulating film therebetween, the first source/drain regions are formed by implanting the impurity of the second type conductivity to the top end of the standing wall portion, and the second source/drain regions are formed by implanting the impurity of the second type conductivity to the bottom surface of the semiconductor substrate surrounded by the inner surface of the standing wall portion, and, therefore, the vertical type semiconductor device whose standing wall portion functions as a channel regions can readily be manufactured. Furthermore, the vertical type semiconductor device having the first gate electrode and the second gate electrode can readily be manufactured.

The method of manufacturing the semiconductor device, in yet another aspect of the invention, includes the steps of forming a standing wall portion having inner and outer surfaces and extending in a tubular manner on a main surface of a semiconductor substrate of first type conductivity, forming a first gate electrode of a tubular shape on the inner surface of the standing wall portion with a first gate insulating film therebetween, forming a second gate electrode of a tubular shape on the outer surface of the standing wall portion with a second gate insulating film therebetween, forming first source/drain regions by implanting an impurity of second type conductivity to the top end of the standing wall portion, forming second source/drain regions by implanting an impurity of the second type conductivity on the bottom surface of the semiconductor substrate surrounded by the inner surface of the standing wall portion, forming a capacitor lower electrode to be electrically connected to the second source/drain regions, and forming a capacitor upper electrode on the capacitor lower electrode with a capacitor insulating film therebetween.

Since the standing wall portion having the inner and outer surfaces and extending in a tubular manner is formed on the main surface of the semiconductor substrate of the first type conductivity, the first gate electrode of a tubular shape is formed on the inner surface of the standing wall portion with the first gate insulating film therebetween, the second gate electrode of a tubular shape is formed on the outer surface of the standing wall portion with the second gate insulating film therebetween, the first source/drain regions are formed by implanting the impurity of the second type conductivity to the top end of the standing wall portion, the second source/drain regions are formed by implanting the impurity of the second type conductivity onto the bottom surface of the semiconductor substrate surrounded by the inner surface of the standing wall portion, the capacitor lower electrode is formed to be electrically connected to the second source/drain regions, and the capacitor upper electrode is formed on the capacitor lower electrode with the capacitor insulating film therebetween, the vertical type semiconductor device whose standing wall portion functions as a channel region can readily be manufactured. Furthermore, the vertical semiconductor device having two gate electrodes, the first gate electrode and the second gate electrode can readily be manufactured. Furthermore, the capacitor formed of the capacitor lower electrode, the capacitor insulating film, and the capacitor upper electrode is electrically connected to the second source/drain regions, and, therefore, the semiconductor device having a storage region suitable for high density integration can readily be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in conjunction with the appended drawings.

Figure 1:
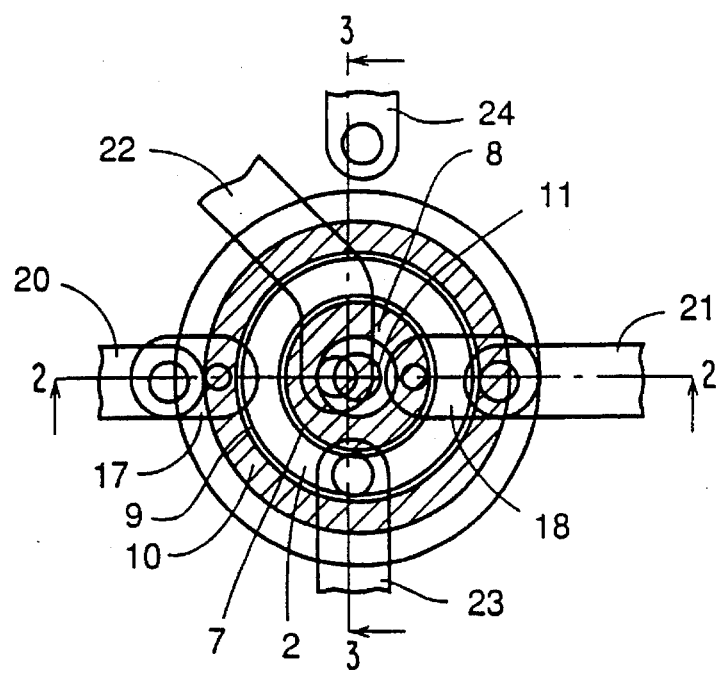
FIG. 1 is a plan view showing an MIS type semiconductor device (an MIS type field effect transistor) in accordance with a first embodiment of the invention.
Figure 2:
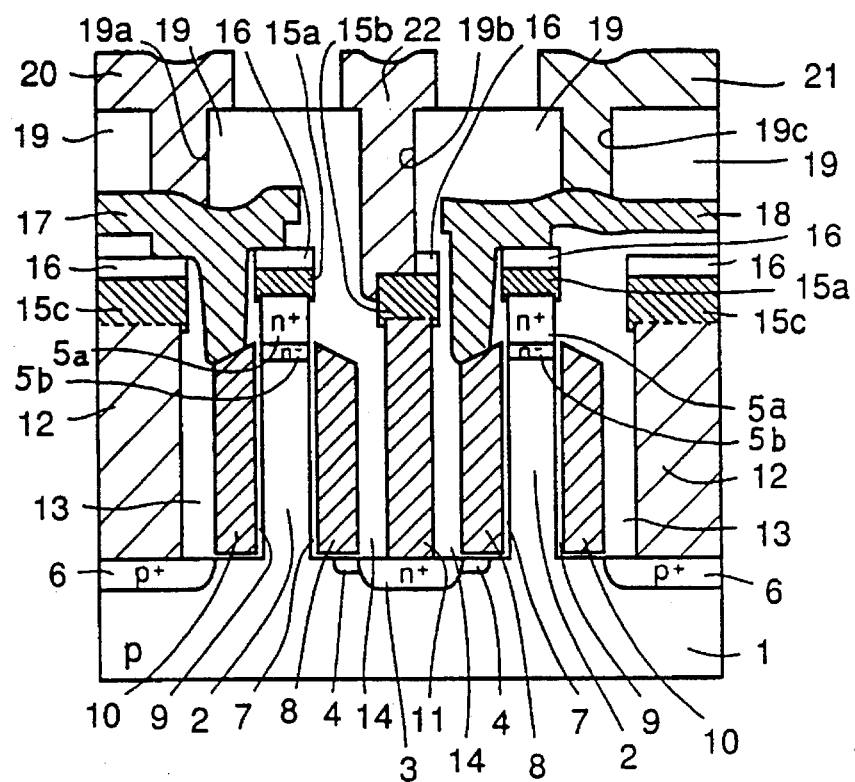
FIG. 2 is a cross sectional view showing the structure of the MIS type semiconductor device in accordance with the first embodiment shown in FIG. 1 taken along line X—X.

FIG. 1 is a plan view showing a vertical type MIS semiconductor device (MIS field effect transistor) in accordance with a first embodiment of the invention. FIG. 2 is a cross section view showing the structure of the MIS semiconductor device shown in FIG. 1 taken along line X—X.

Figure 3:
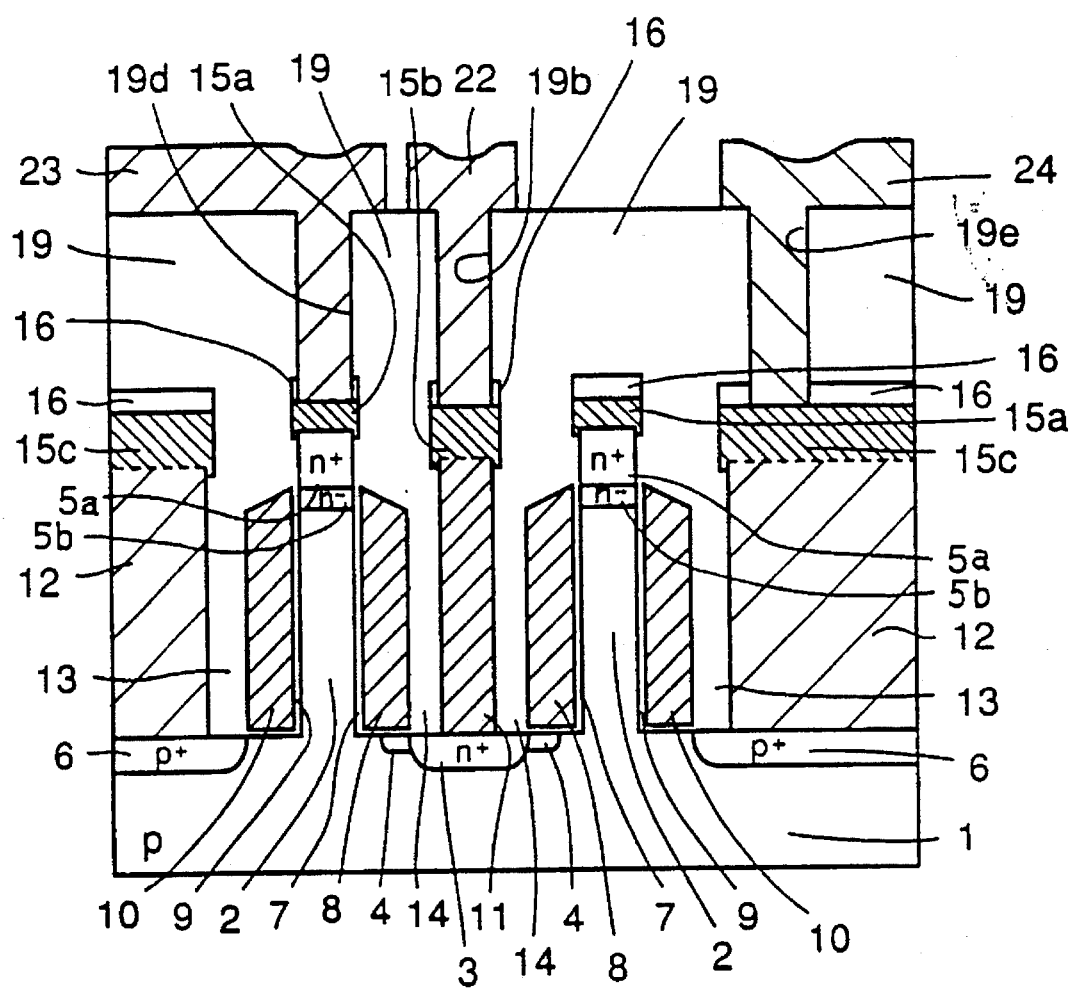
FIG. 3 is a cross sectional view showing the structure of the MIS type field effect transistor in accordance with the first embodiment shown in FIG. 1 taken along line Y—Y.

FIG. 3 is a cross sectional view showing the structure of the MIS semiconductor device shown in FIG. 1 taken along line Y—Y.

Referring to FIGS. 1–3, the vertical type MIS semiconductor device in accordance with the first embodiment includes a p type monocrystalline silicon substrate 1, a cylindrical portion (standing wall portion) 2 of monocrystalline silicon and extending from a prescribed region on a main surface of the P type monocrystalline silicon substrate 1 in a direction vertical to the main surface of the p type monocrystalline silicon substrate 1, a first gate electrode 8 of polysilicon formed on the inner surface of the cylindrical portion 2 with a first gate oxide film 7 of $SiO_2$ therebetween, a second gate electrode 10 of polycrystalline silicon formed on the outer surface of the cylindrical portion 2 with a second gate oxide film 9 of $SiO_2$ therebetween, highly concentrated n type source/drain regions 5a formed on the top end of the cylindrical portion 2, n type source/drain regions 5b of a low concentration serially formed on the ends of the source/drain regions 5a, highly concentrated n type source/drain region 3 formed on the bottom surface of the p type monocrystalline silicon substrate 1 surrounded by the inner surface of the cylindrical portion 2, n type source/drain regions 4 of a low concentration serially formed on the opposite ends of the source/drain region 3, and a $p^+$ impurity region 6 formed on the main surface of the p type monocrystalline silicon substrate 1 a prescribed distance apart from the cylindrical portion 2 for fixing the potential of the substrate and isolating elements. The source/drain regions 5a and 5b, the source/drain regions 3 and 4, the cylindrical portion 2, the first gate electrode 8, and the second gate electrode 10 constitute a vertical type field effect transistor (FET).

Electrically connected to the source/drain region 3 is an interconnection layer 11. An interconnection layer 12 is electrically connected to the $p^+$ impurity region 6. Conductive layers 15a, 15b, and 15c are formed on the source/drain regions 5a, 5b, the interconnection layer 11, and the interconnection layer 12, respectively. An insulating film 16 of a silicon nitride film is formed on the conductive layers 15a, 15b, and 15c. An interlayer insulating film 13 of $SiO_2$ is formed between the interconnection layer 12 and the second gate electrode 10. An interlayer insulating film 14 of $SiO_2$ is formed between the interconnection layer 11 and the first gate electrode 10. An interlayer insulating film 14 of $SiO_2$ is formed between the interconnection layer 11 and the first gate electrode 8. An interconnection layer 18 is electrically connected to the first gate electrode 8 with an interconnection layer 17 being electrically connected to the second electrode 10. An interlayer insulating film 19 having contact holes 19a, 19b, and 19c is formed covering the interconnection layer 17, the conductive layer 15, and the interconnection layer 18. A metal interconnection layer 20 is formed to be electrically connected to the interconnection layer 17 in the contact hole 19a and to extend along the surface of the interlayer insulating film 19. A metal interconnection layer 22 is formed to be electrically connected to the conductive layer 15 in the contact hole 19b. A metal interconnection layer 21 is formed to be electrically connected to the interconnection layer 18 in the contact hole 19c and to extend along the surface of the interlayer insulating film 19.

As shown in FIG. 3, a metal interconnection layer 23 is electrically connected to the conductive layer 15a formed on the source/drain region 5a through a contact hole 19d. A metal interconnection layer 24 is electrically connected to the conductive layer 15c formed on the interconnection layer 12 through a contact hole 19e. The interconnection layers 11, 12, 17, and 18 are all formed of polycrystalline silicon. The conductors 15a, 15b, 15c are all formed of polycrystalline silicon. The metal interconnection layers 20, 21, 22, 23, and 24 are formed of aluminum or the like.

As described above, in this embodiment, the cylindrical portion 2 formed extending in the vertical direction from the prescribed region on the main surface of the p type monocrystalline silicon substrate 1 is used as the channel region of the FET. The threshold voltage of the FET is controlled by two gate electrodes, i.e. the first gate electrode 8 formed on the inner surface of the cylindrical portion 2 and the second electrode 10 formed on the outer surface of the cylindrical portion 2. More specifically, setting a voltage applied to the first gate electrode 8 and a voltage applied to the second gate electrode 10 to be respective prescribed values provides easy and accurate control of the threshold voltage without requiring change of the materials of the gate electrodes as have been conventionally practiced. Principles and a method of controlling threshold voltage using two gate electrodes are disclosed in, for example, an article entitled "High Performance Characteristics in Trench Dual-Gate MOSFET (TDMOS)", IEEE ED VOL. 38, No. 9, September 1991, pp. 2121–2127.

More specifically, the first gate electrode 8 is used as a main gate, and the second electrode 10 is used as a sub gate. Under such a condition, when the voltage of the second gate electrode (sub gate) 10 is fixed to 0 V, the threshold voltage $V_{TH}$ becomes 0.6 V. When the second gate electrode (sub gate) 10 is fixed to −0.4 V, the threshold voltage $V_{TH}$ becomes 0.8 V. More specifically, the threshold voltage can readily be controlled by applying to the second gate electrode (sub gate) 10, the negative voltage (−0.4 V) of a voltage (0.4 V) corresponding to twice the amount of the threshold voltage desired to be changed (0.2 V). Furthermore, according to the method of controlling the threshold voltage by the two gate electrodes, the first gate electrode 8 and the second gate electrode 10 as described above, the threshold voltage can be controlled after completion of the elements as opposed to conventional methods. Thus, the threshold voltage can be controlled depending upon the levels of noises included in an input signal.

In this embodiment, since the sidewall portion of the cylindrical portion 2 of monocrystalline silicon is used as the channel region, area occupied by the elements can be reduced as compared to conventional planar type (plane type) transistors. Consequently, MIS type semiconductor devices suitable for high density integration can be provided. Furthermore, the $p^+$ impurity region 6 for fixing the potential of the substrate can also be used for element isolation, it will not be necessary to form an LOCOS (Local Oxidation of Silicon) oxide film for element isolation. As a result, the semiconductor device of this embodiment will not suffer from the disadvantage that the isolation region is expanded by the bird's beaks of an LOCOS oxide film when the LOCOS oxide film is used for element isolation. Therefore, in the structure of this embodiment shown in FIGS. 2 and 3, integration density can be increased as compared to the one employing the LOCOS oxide film for element isolation.

Furthermore, a complete depletion type FET, the cylindrical portion 2 of which is entirely depleted can be formed by reducing the thickness of the cylindrical portion 2. Such a complete depletion type FET provides good switching characteristics. This makes it possible to set the threshold voltage of the FET to a low level. In the MIS type semiconductor device in accordance with this embodiment, the threshold voltage can readily be controlled by the first gate electrode 8 and the second gate electrode 10, and, therefore, there will not be any problem if the threshold voltage can not be controlled by channel doping with the thickness of the cylindrical portion 2 being reduced.

FIGS. 4–44 are cross sectional views for use in illustration of a manufacturing process of the MIS type semiconductor device in accordance with the first embodiment shown in FIGS. 1–3. Referring to FIGS. 1–3 and FIGS. 4–44, a description of the manufacturing process of the MIS type semiconductor device in accordance with the first embodiment follows.

Figure 4:
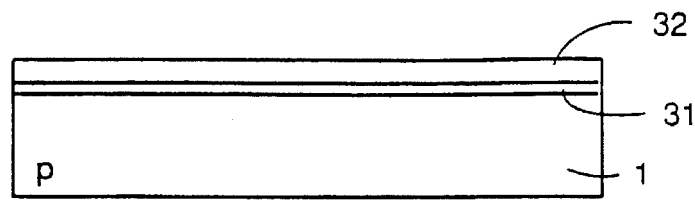
FIGS. 4–43 are cross sectional views showing steps (1st-39th) in a manufacturing process of the MIS type field effect transistor in accordance with the first embodiment shown in FIG. 2.

As shown in FIG. 4, a silicon oxide film ($SiO_2$) 31 is formed on a p type monocrystalline silicon substrate 1. A silicon nitride film ($Si_3N_4$) is formed on the silicon oxide film 31.

Figure 5:
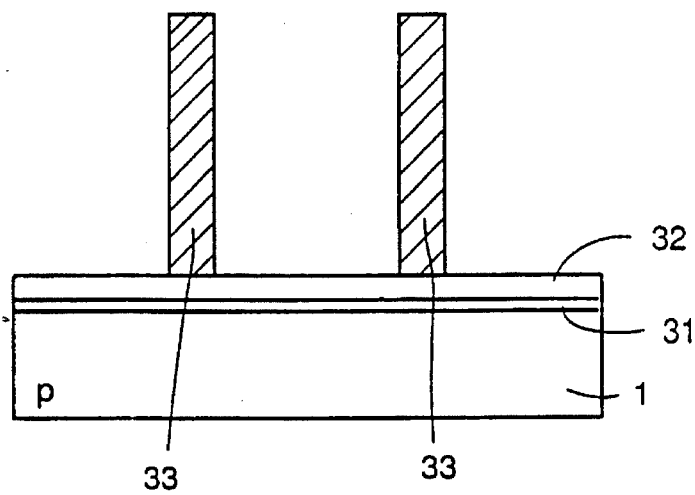

Then, as shown in FIG. 5, cylindrical resist 33 is formed in a prescribed region on the silicon nitride film 32 by means of a photolithography technique. The silicon nitride film 32 and the silicon oxide film 31 are anisotropically etched using the cylindrical resist 33 as mask to form a cylindrical silicon nitride film 32 and a silicon oxide film 31. Then, the resist 33 is removed away.

Figure 6:
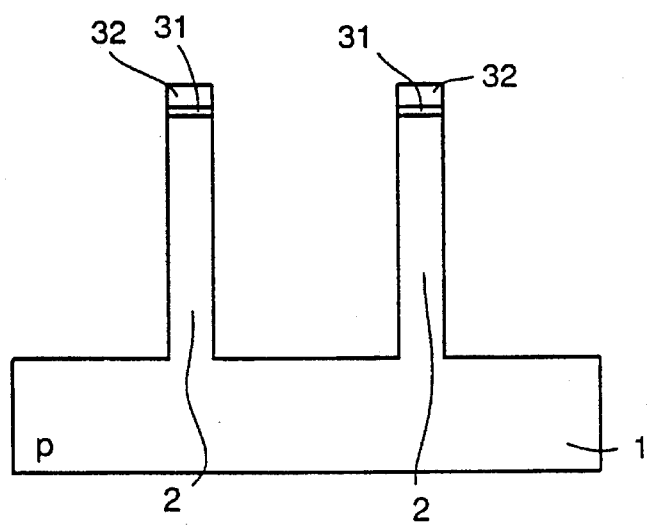

Then, as shown in FIG. 6, the p type monocrystalline silicon substrate 1 is anisotropically etched, using as mask the cylindrical silicon nitride film 32 and the silicon oxide film 31, and a cylindrical portion 2 is formed.

Figure 7:
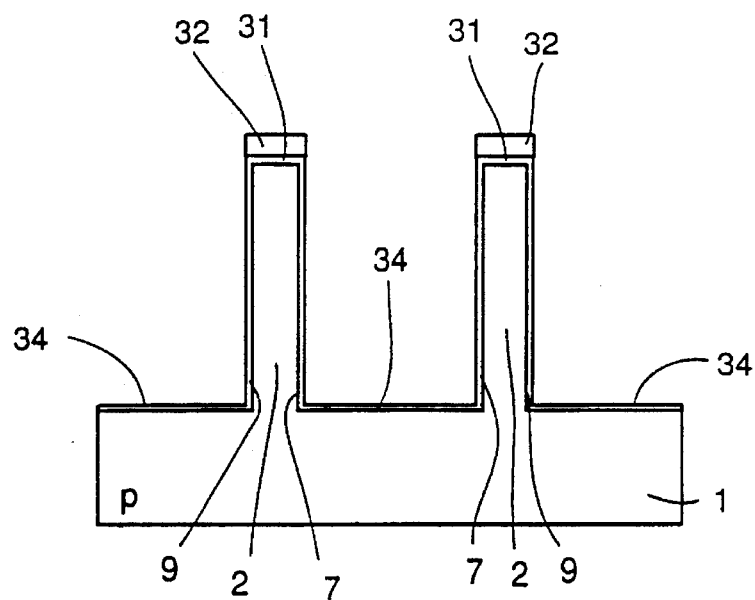

As shown in FIG. 7, a thermal oxide film 34 of $SiO_2$ is formed on a main surface of the p type monocrystalline silicon substrate 1, while a first gate oxide film 7 and a second gate oxide film 9 both of $SiO_2$ are formed on the inner surface and the outer surface of the cylindrical portion 2, respectively.

Figure 8:
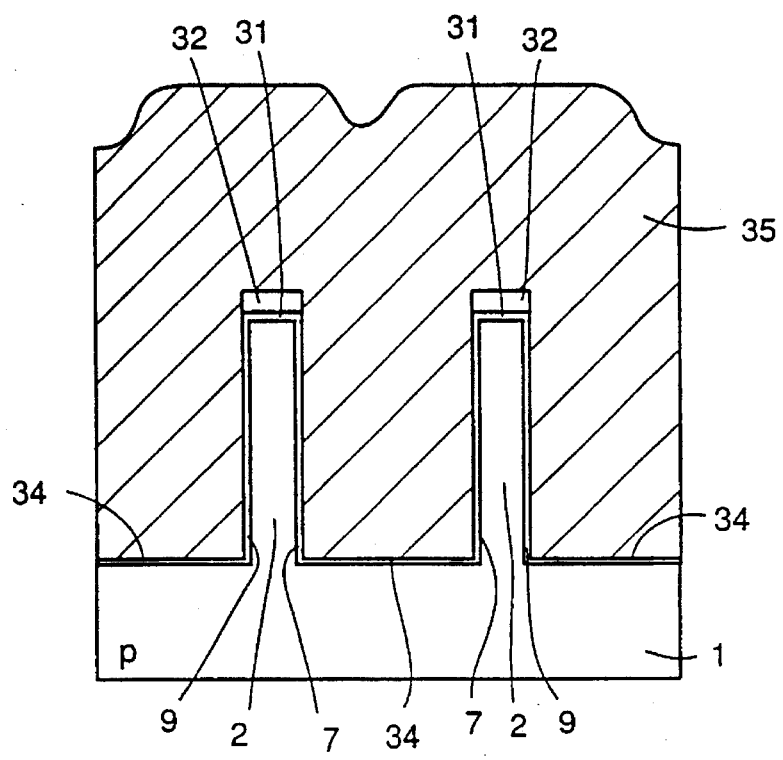

As shown in FIG. 8, a polycrystalline silicon film 35 is formed to cover the p type monocrystalline silicon substrate 1 and the cylindrical portion 2 by means of Chemical Vapor Deposition.

Figure 9:
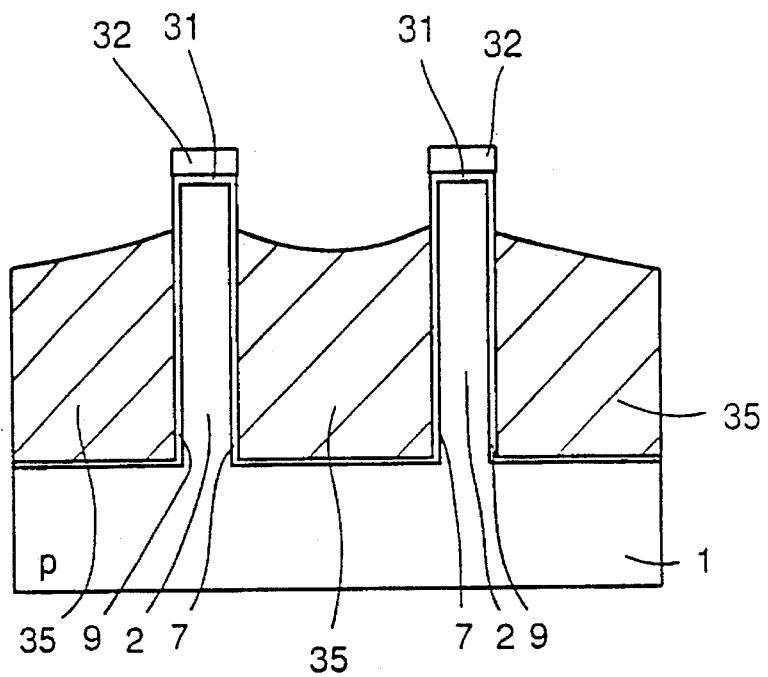

As shown in FIG. 9, the surface of the polycrystalline silicon film 35 is planarized by means of a polishing method or a resist etch back method. Thereafter, the polycrystalline silicon film 35 is etched back to a prescribed thickness so that the upper portion of the cylindrical portion 2 is exposed.

Figure 10:
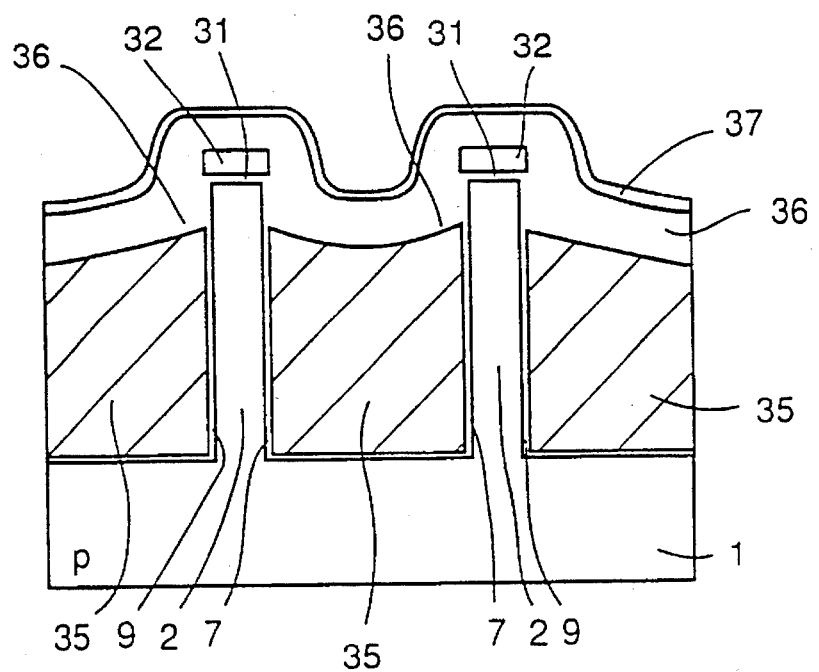

Then, as shown in FIG. 10, a silicon oxide film 36 is formed on the entire surface by means of CVD. A silicon nitride film 37 is formed on the silicon oxide film 36.

Figure 11:
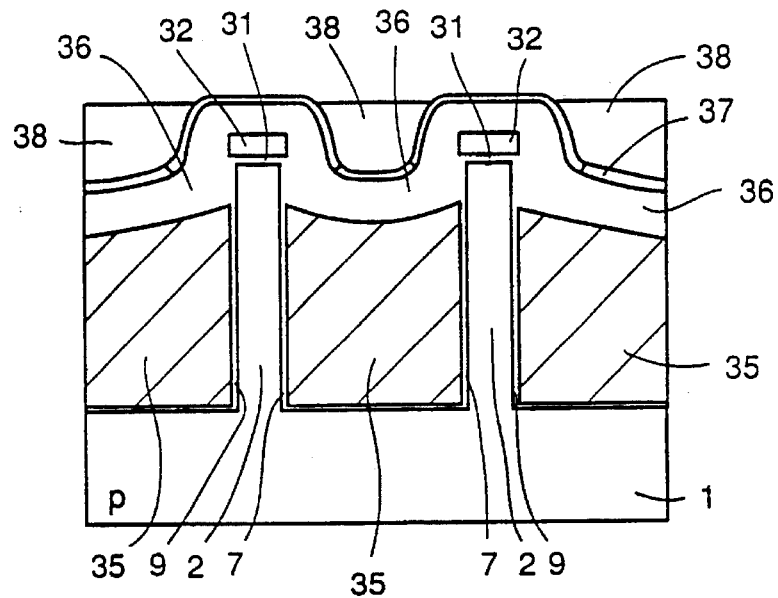

As shown in FIG. 11, a silicon oxide film 38 is formed so that only the silicon oxide film 37 positioned in the upper part of the cylindrical portion 2 is exposed and the entire surface is planarized.

Figure 12:
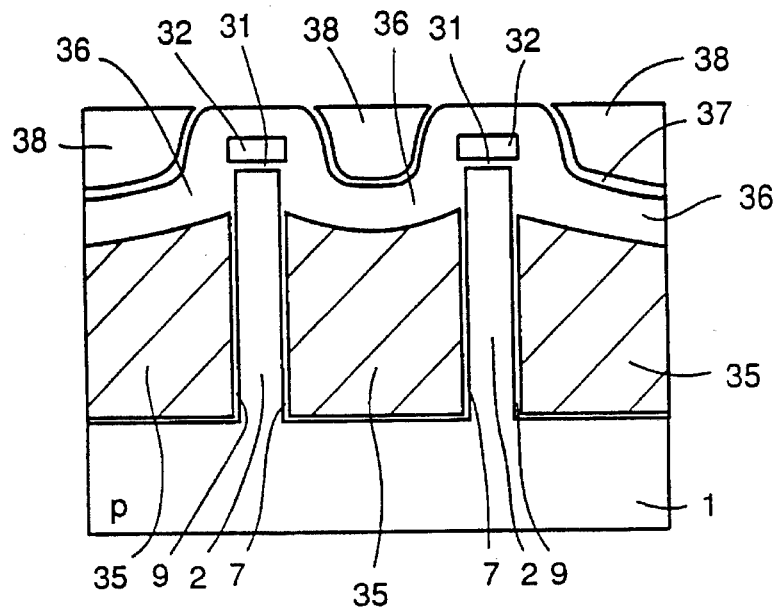

As shown in FIG. 12, the exposed silicon nitride film 37 positioned in the upper part of the cylindrical portion 2 is removed away by a chemical treatment.

Figure 13:
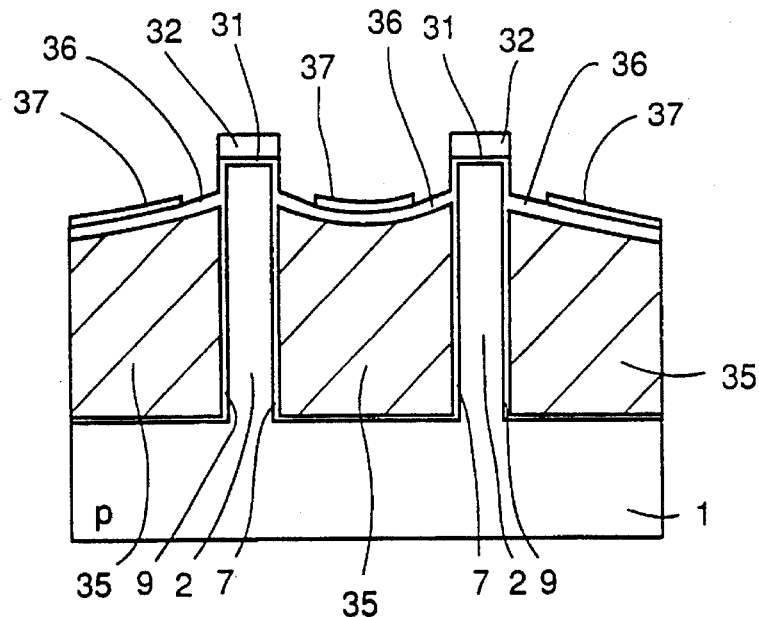

As shown in FIG. 13, the silicon oxide film 38 (see FIG. 12) is entirely etched away, and the silicon oxide film 36 positioned in the upper part and the upper side end portion of the cylindrical portion 2 is etched away.

Figure 14:
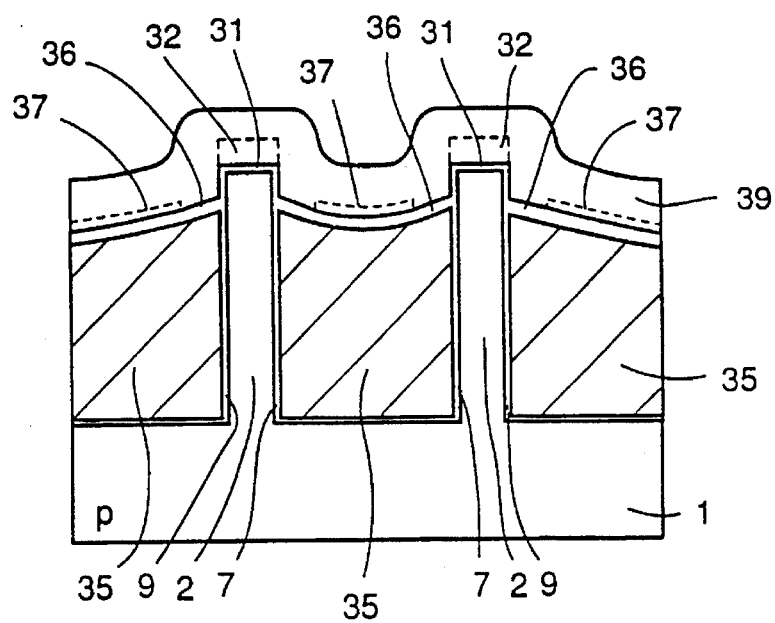

As shown in FIG. 14, a silicon nitride film 39 is formed on the entire surface.

Figure 15:
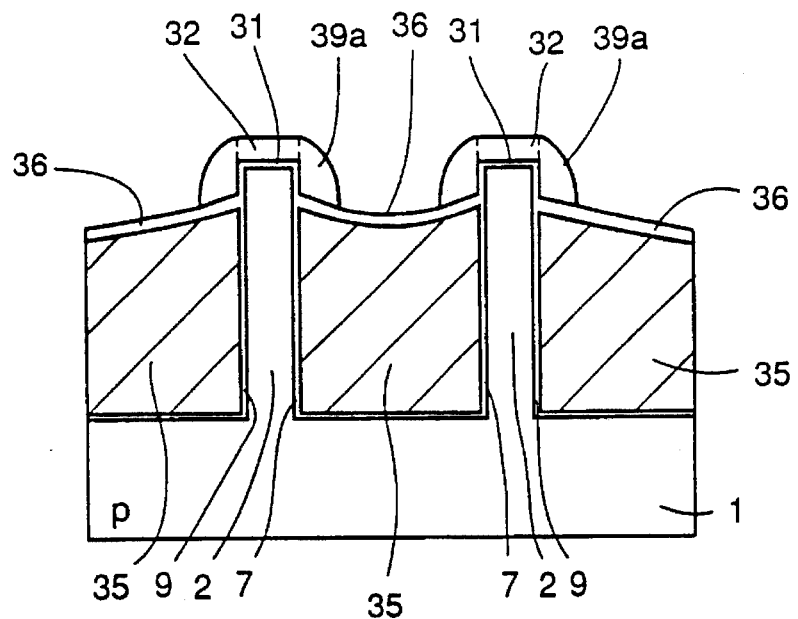

As shown in FIG. 15, the entire surface of the silicon nitride film 39 is anisotropically etched, and a sidewall 39a of a silicon nitride film is formed on the upper sidewall portion of the cylindrical portion 2. The upper part of the cylindrical portion 2 is surrounded by the silicon nitride film 32 and the sidewall 39a of silicon nitride film.

Figure 16:
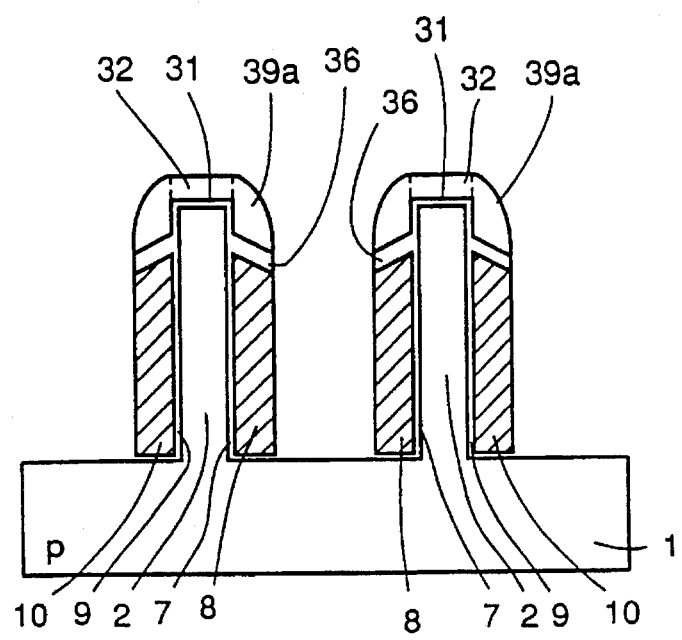

As shown in FIG. 16, using as mask the silicon nitride film 32 and the sidewall 39a of silicon nitride film, the silicon oxide film 36 and the polycrystalline silicon film 35 are etched. Thus, the first gate electrode 8 of a cylindrical shape is formed on the inner surface of the cylindrical portion 2 with the first gate oxide film 7 therebetween, and the second gate electrode 10 of a cylindrical shape is formed on the outer surface of the cylindrical portion 2 with the second gate oxide film 9 therebetween.

Figure 17:
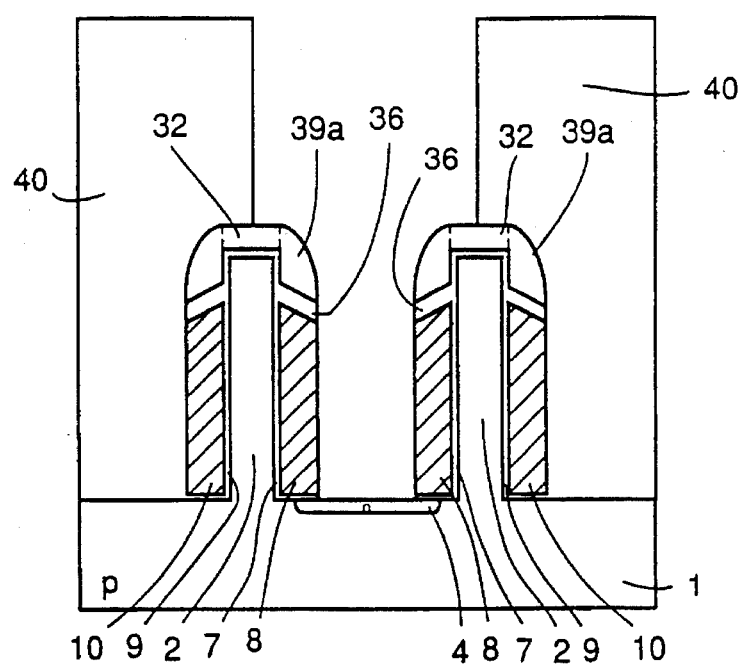

As shown in FIG. 17, resist 40 covering the outside of the cylindrical portion 2 is formed by means of a photolithography technique. Impurity ions of n type are implanted into the p type monocrystalline silicon substrate 1, using the resist 40, the silicon nitride film 32, and the sidewall 39a as mask. Thus, the n type source/drain region 4 of a low impurity concentration is formed. Then, the resist 40 is removed away.

Figure 18:
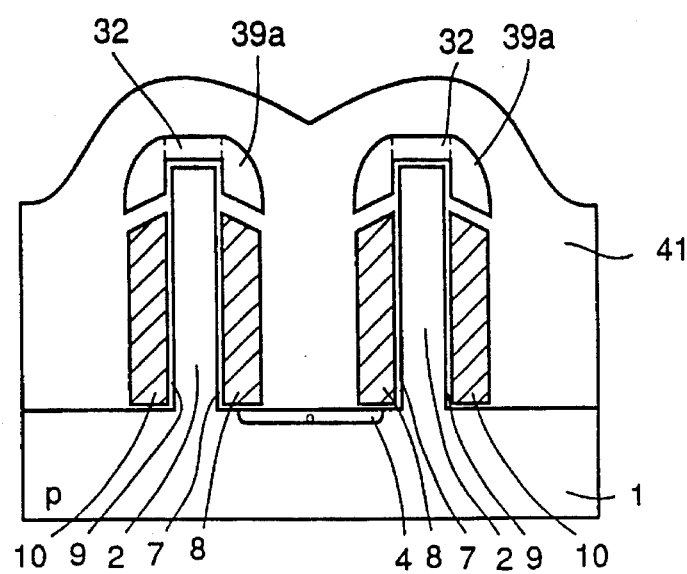

As shown in FIG. 18, a silicon oxide film 41 is formed to cover the entire surface by means of CVD.

Figure 19:
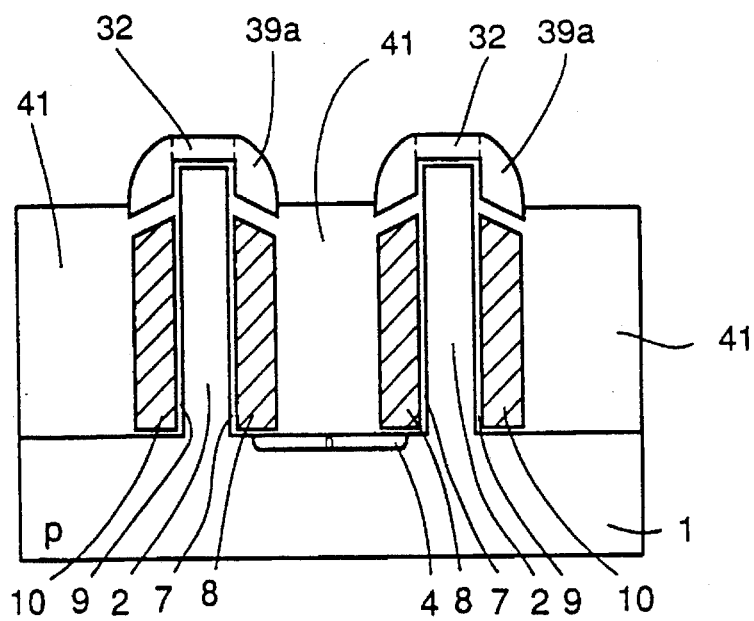

As shown in FIG. 19, after the surface of the silicon oxide film is planarized, the silicon oxide film 41 is etched back until the silicon nitride film 32 and the sidewall 39 are exposed.

Figure 20:
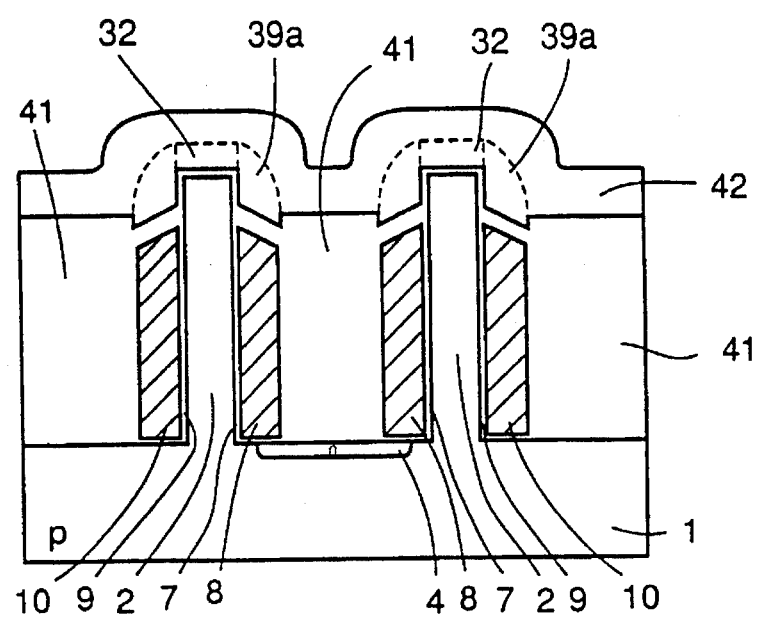

As shown in FIG. 20, a silicon nitride film 42 is formed on the entire surface.

Figure 21:
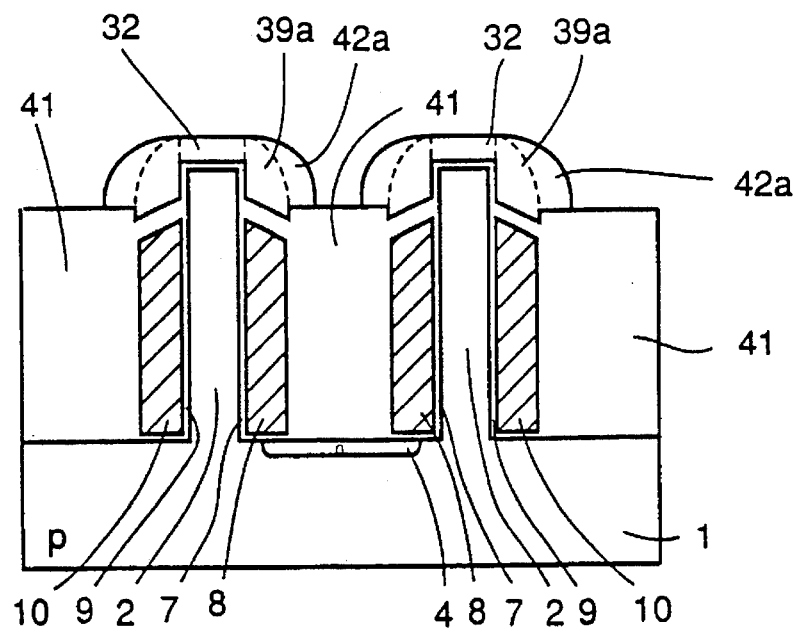

As shown in FIG. 21, the silicon nitride film 42 (see FIG. 20) is anisotropically etched, and a sidewall 42a formed of a silicon nitride film is formed on the sidewall portion of the sidewall 39a of silicon nitride film.

Figure 22:
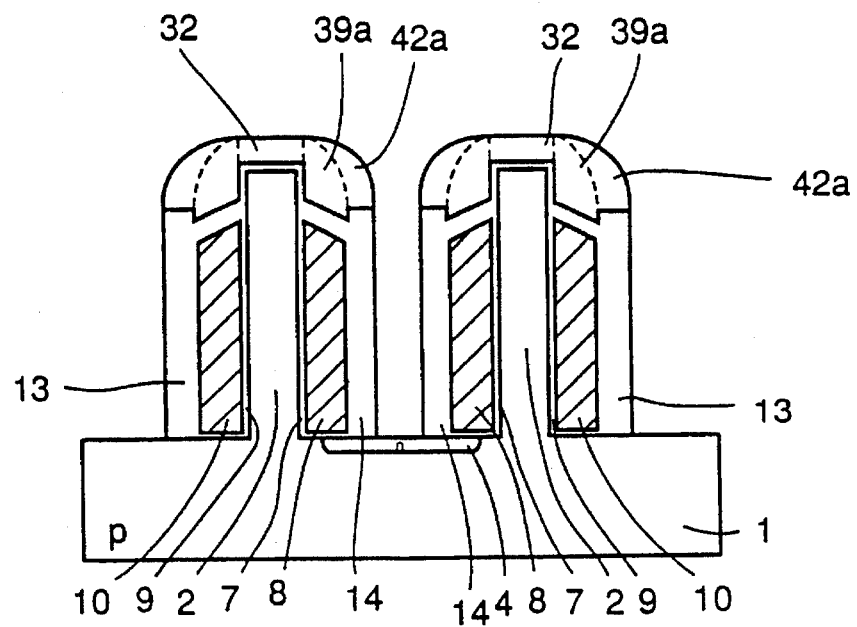

As shown in FIG. 22, using as mask the silicon nitride film 32, the sidewall 39a of silicon nitride film, and the sidewall 42a, the silicon oxide film 41 is etched. Thus, the interlayer insulating film 14 of a silicon oxide film is formed on the inner surface of the first gate electrode 8, and the interlayer insulating film 13 formed of silicon oxide film is formed on the outer surface of the second gate electrode 10.

Figure 23:
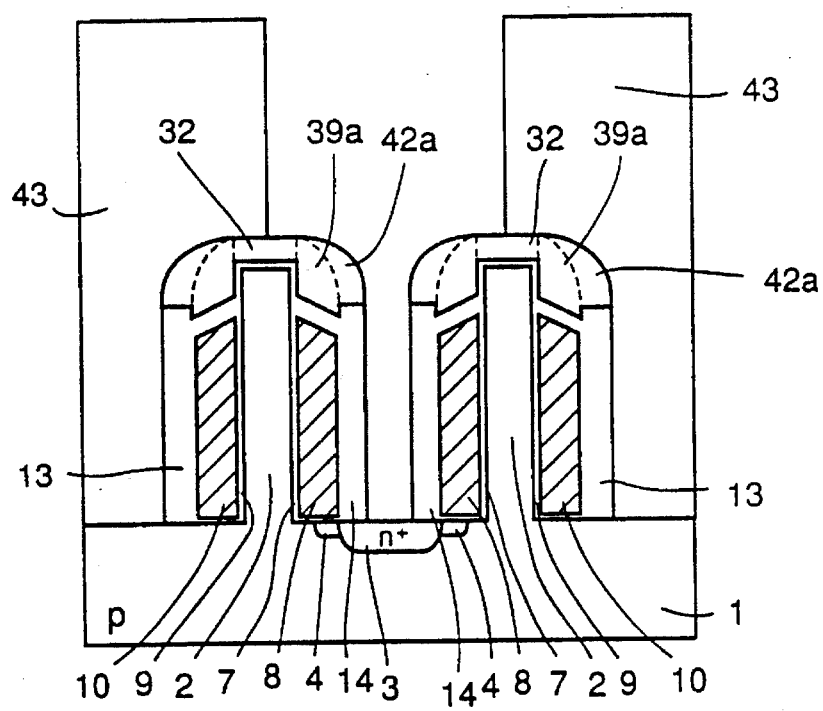

As shown in FIG. 23, resist 43 covering the outside of the cylindrical portion 2 is formed by means of a photolithography technique. Using as mask the resist 43, the silicon nitride film 32, the sidewalls 39a and 42a, n type impurity ions are implanted into the p type monocrystalline silicon substrate 1, and the highly concentrated n type source/drain regions 3 are formed. Thereafter, the resist 43 is removed away.

Figure 24:
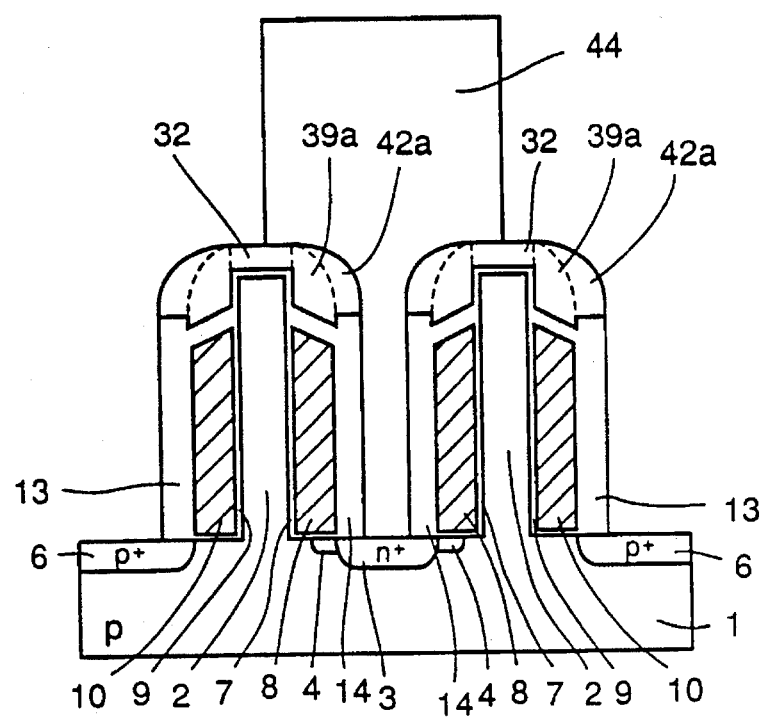

As shown in FIG. 24, resist 44 covering the inside of the cylindrical portion 2 is formed by means of a photolithography technique. Using the resist 44, the silicon nitride film 32, and the sidewalls 39a and 42a as mask, p type impurity ions are implanted into the p type monocrystalline silicon substrate 1, and the $p^+$ impurity region 6 is formed on the outer bottom portion of the cylindrical portion 2. The $p^+$ impurity region 6 fixes the potential of the substrate and has a function of isolating elements. Thereafter, the resist 44 is removed away.

Figure 25:
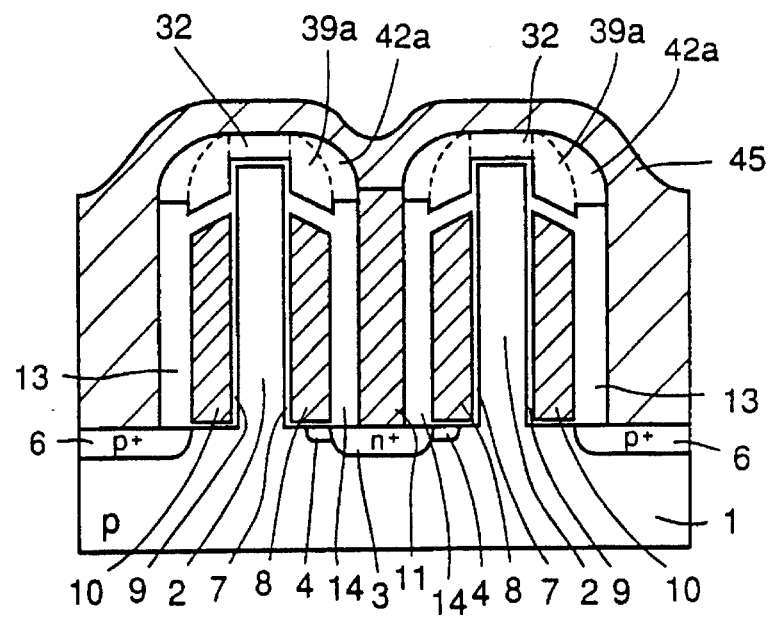

Then, as shown in FIG. 25, a polycrystalline silicon film 45 is formed on the entire surface by means of CVD.

Figure 26:
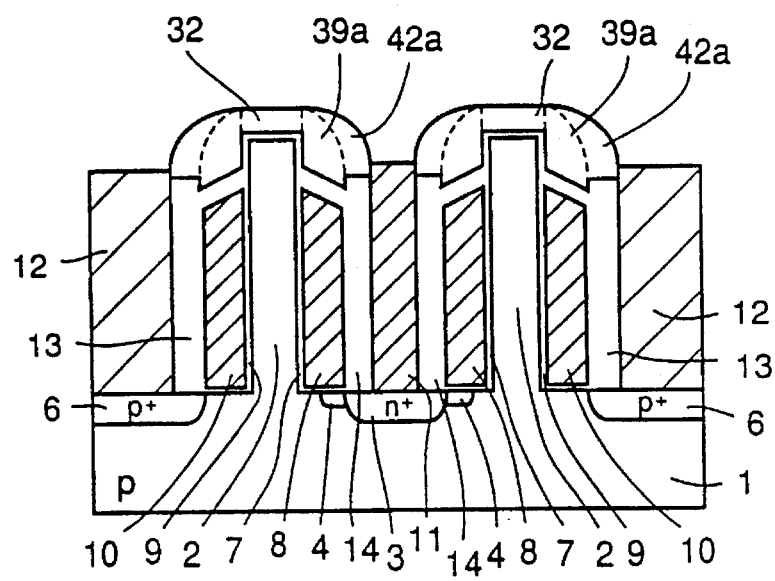

Then, as shown in FIG. 26, after planarizing the surface of the polycrystalline silicon film 45, the polycrystalline silicon film 45 is etched back until the silicon nitride film 32, the sidewall 39a, and the sidewall 42a are exposed. Thus, the interconnection layer 11 connected to the source/drain region 3 and the interconnection layer 12 connected to the $p^+$ impurity region 6 are formed.

Figure 27:
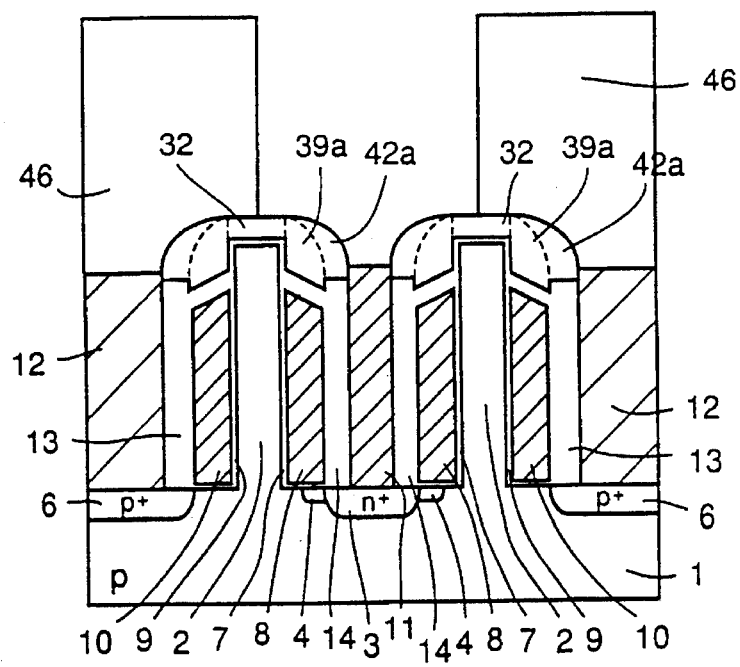

Then, as shown in FIG. 27, resist 46 covering the outside of the cylindrical portion 2 is formed by means of a photolithography technique. Using the resist 46 as mask, n type impurity ions are implanted into the interconnection layer 11. Thereafter, the resist 46 is removed away.

Figure 28:
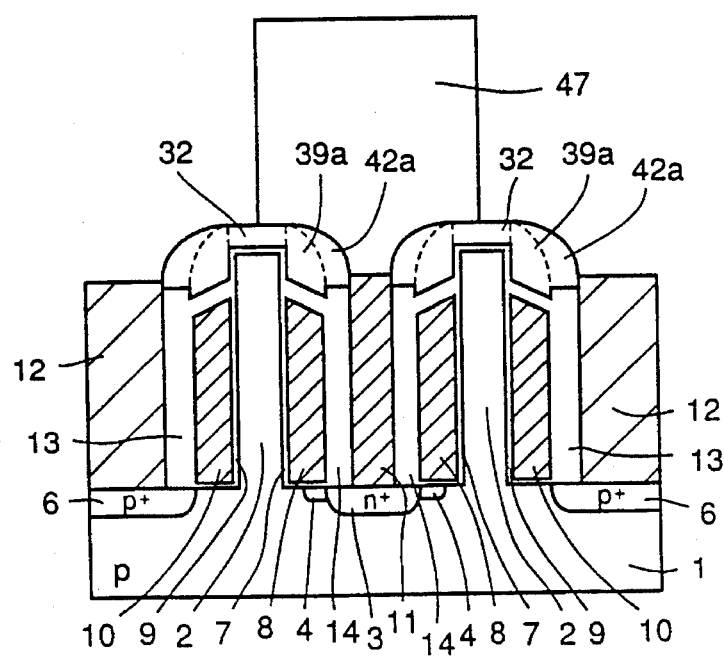

Then, as shown in FIG. 28, resist 47 covering the inside of the cylindrical portion 2 is formed by means of a photolithography technique. Using the resist 47 as mask, p type impurity ions are implanted into the interconnection layer 12. Thereafter, the resist 47 is removed away.

Figure 29:
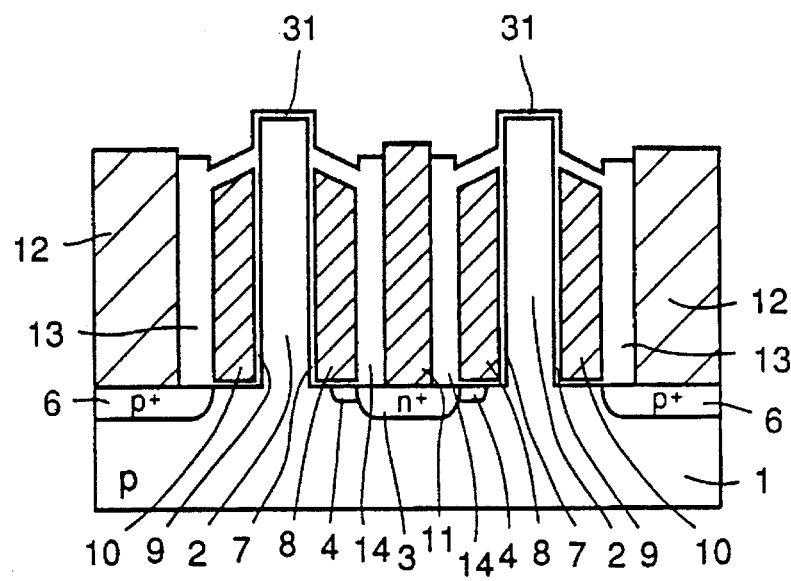

Then, as shown in FIG. 29, the silicon nitride film 32 (see FIG. 28) and the sidewalls 39a and 42a of silicon nitride films (see FIG. 28) are removed away.

Figure 30:
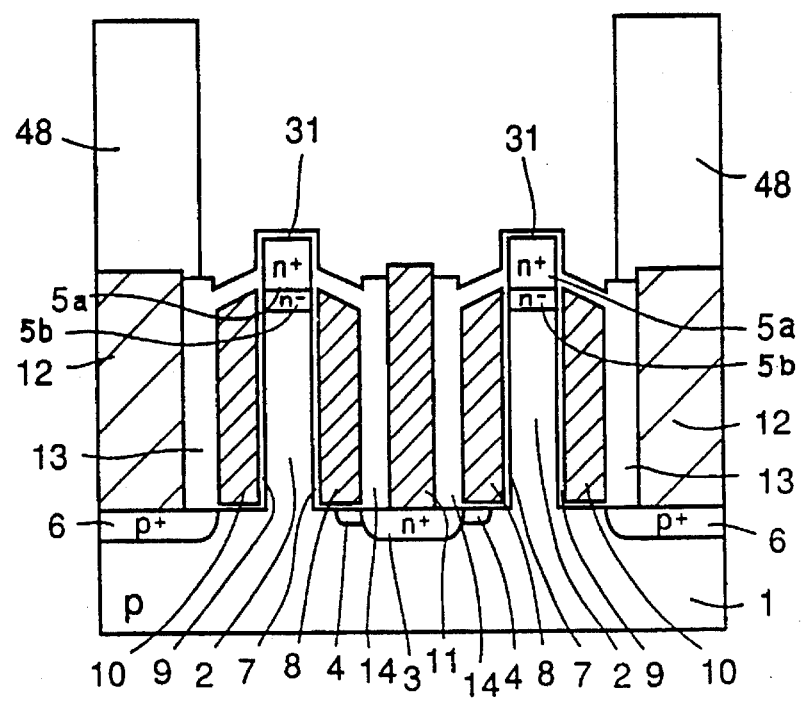

Then, as shown in FIG. 30, resist 48 is formed to cover the interconnection layer 12 by means of a photolithography technique. Using the resist 48 as mask, n type impurity ions are implanted into the upper end portion of the cylindrical portion 2, and the n type source/drain regions 5b of a low impurity concentration, and n type highly concentrated source/drain regions 5a are formed. Thereafter, the resist 48 is removed away.

Figure 31:
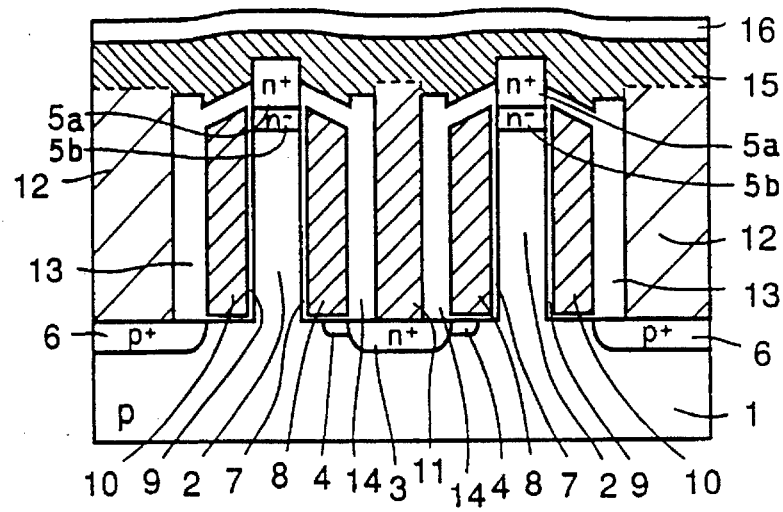
Figure 32:
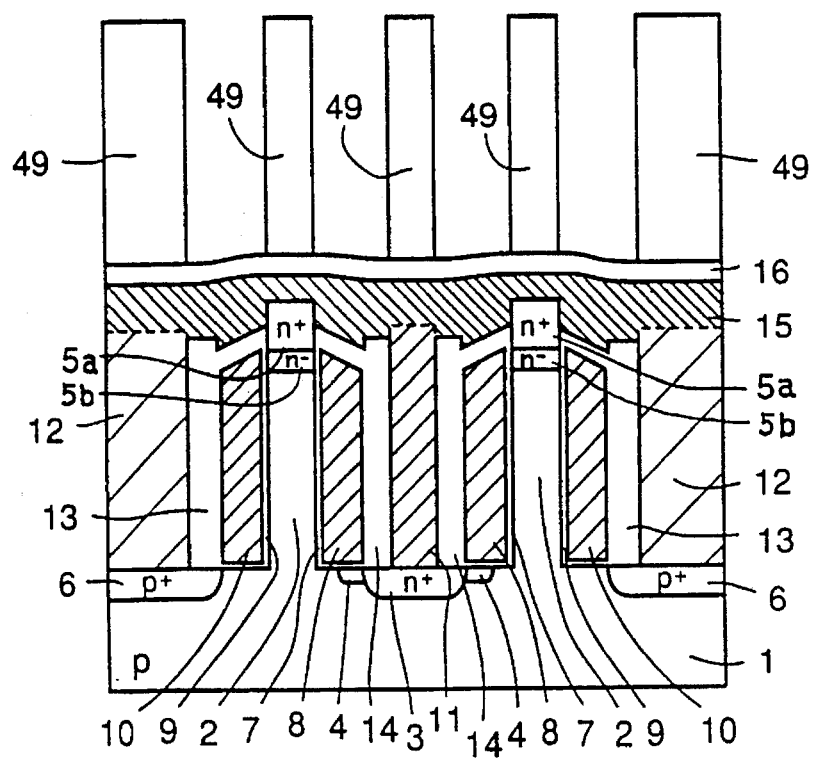

A shown in FIG. 31, the silicon oxide film 31 (see FIG. 30) is removed away by a chemical treatment. A polycrystalline silicon film 15 is formed on the entire surface by means of chemical vapor deposition. A silicon nitride film 16 is formed on the polycrystalline silicon film 15. Then, as shown in FIG. 32, resist 49 is formed in the upper part of the interconnection layer 12 and in the upper part of the cylindrical portion 2 by means of a photolithography technique.

Figure 33:
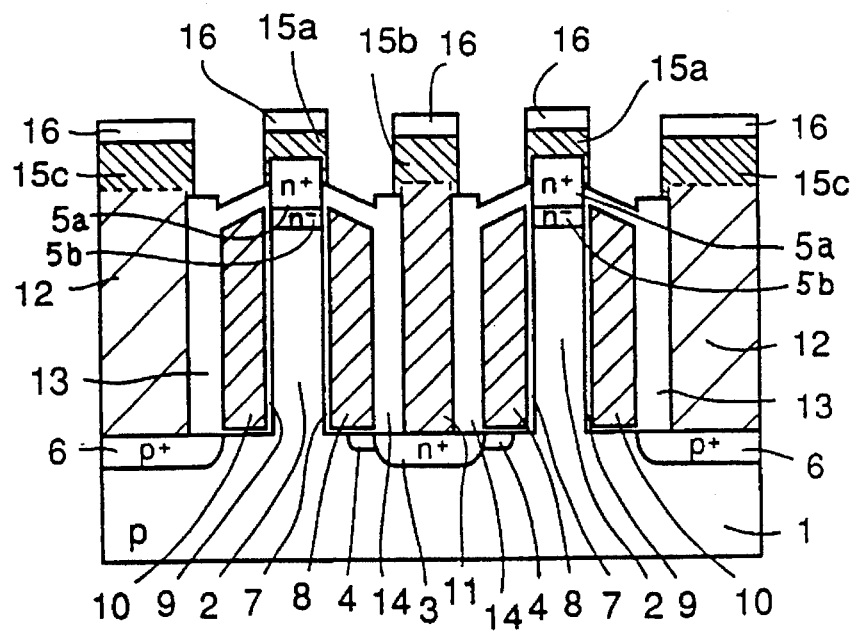

Then, as shown in FIG. 33, using resist 49 (see FIG. 32) as mask, the silicon nitride film 16 and the polycrystalline silicon film 15 are etched. Thus, the conductive layers 15a, 15b, and 15c are formed.

Figure 34:
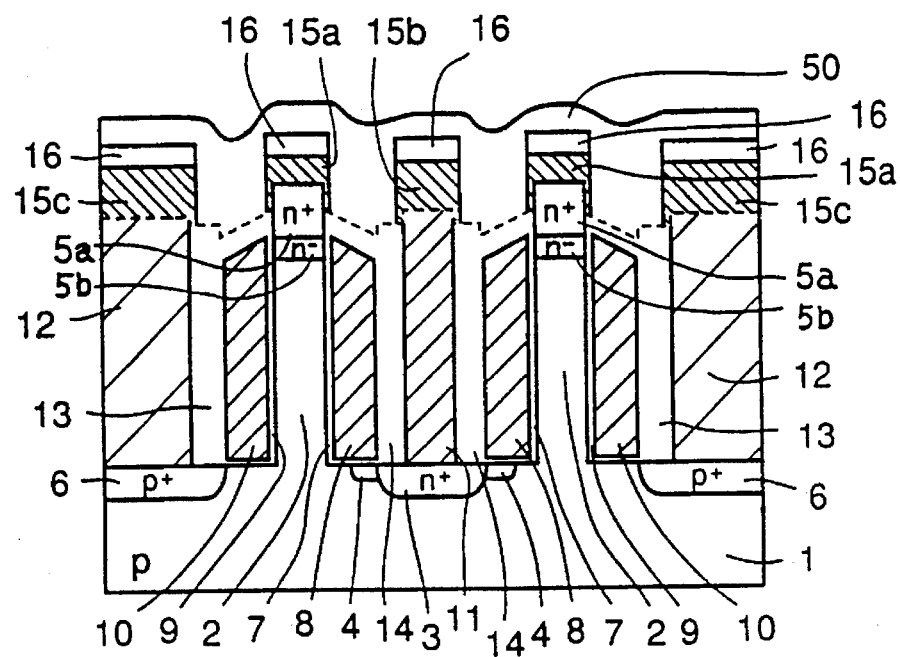

Now, as shown in FIG. 34, a silicon oxide film 50 is formed to cover the entire surface by means of CVD.

Figure 35:
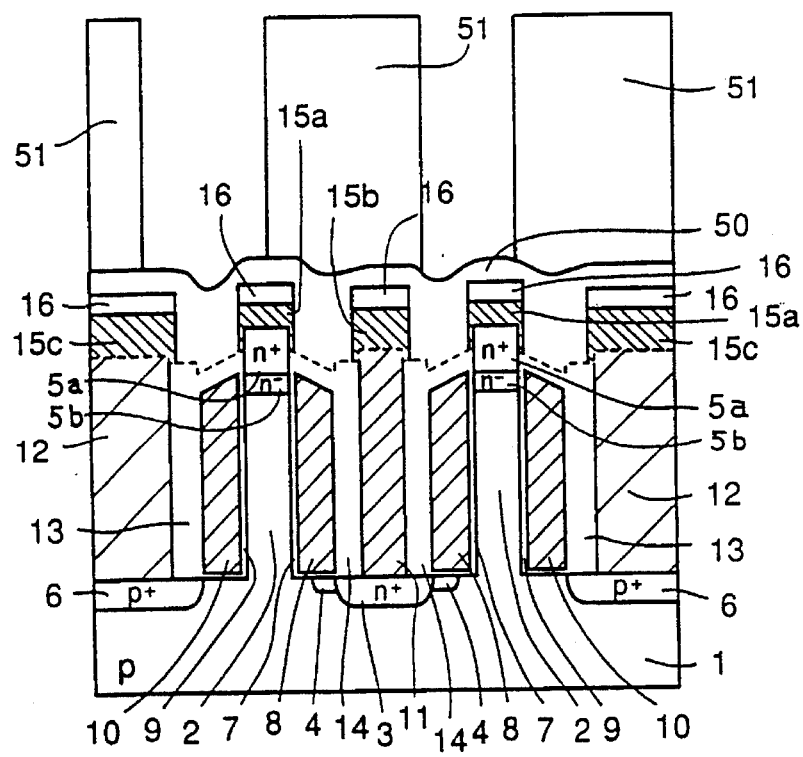

As shown in FIG. 35, resist 51 having a contact hole pattern is formed in a prescribed region on the silicon oxide film 50 by means of a photolithography technique.

Figure 36:
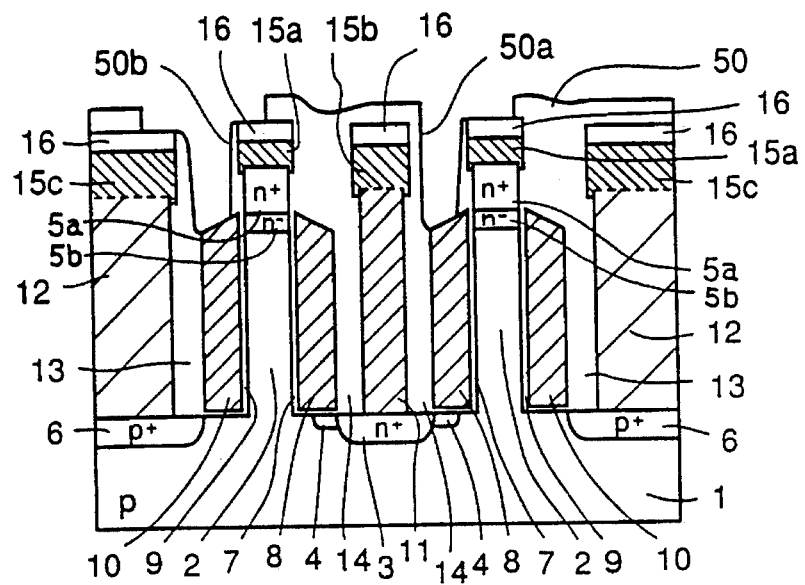

As shown in FIG. 36, using the resist 51 (see FIG. 35) as mask, the silicon oxide film 50, and the interlayer insulating films 13 and 14 of silicon oxide film are etched to form the contact holes 50a and 50b in a self-alignment manner. Thereafter, the resist 51 is removed away.

Figure 37:
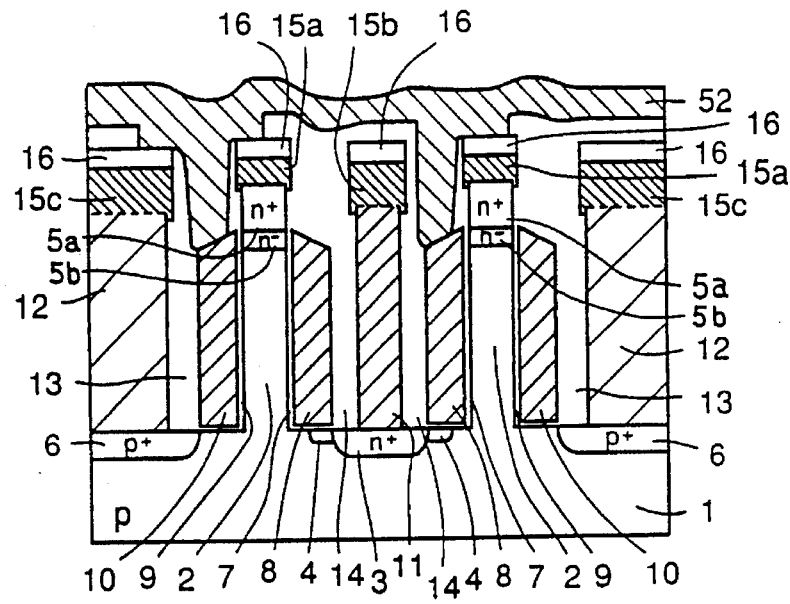

As shown in FIG. 37, a polycrystalline silicon film 52 is formed on the entire surface by means of chemical vapor deposition.

Figure 38:
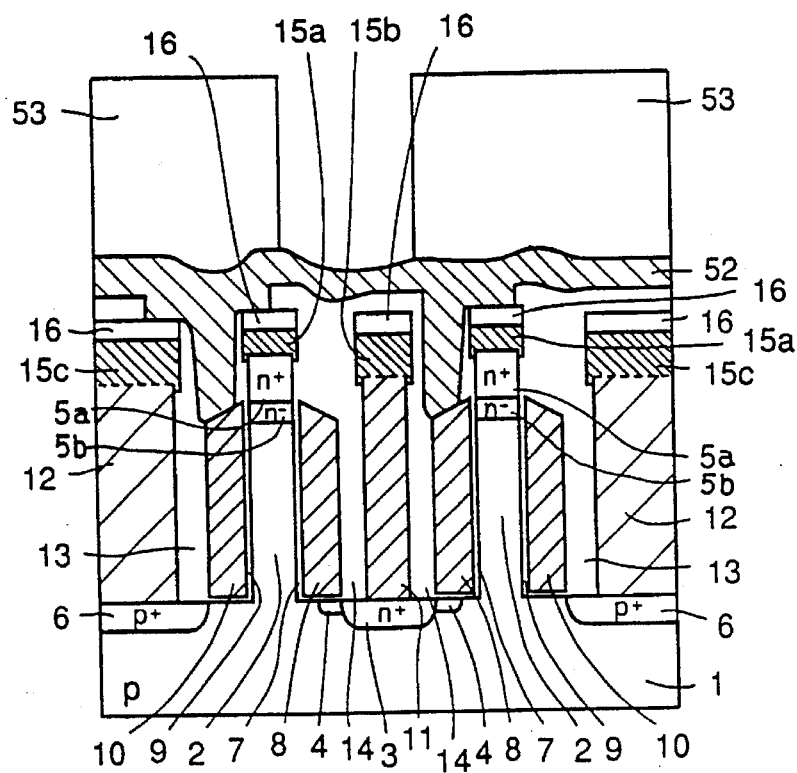
Figure 39:
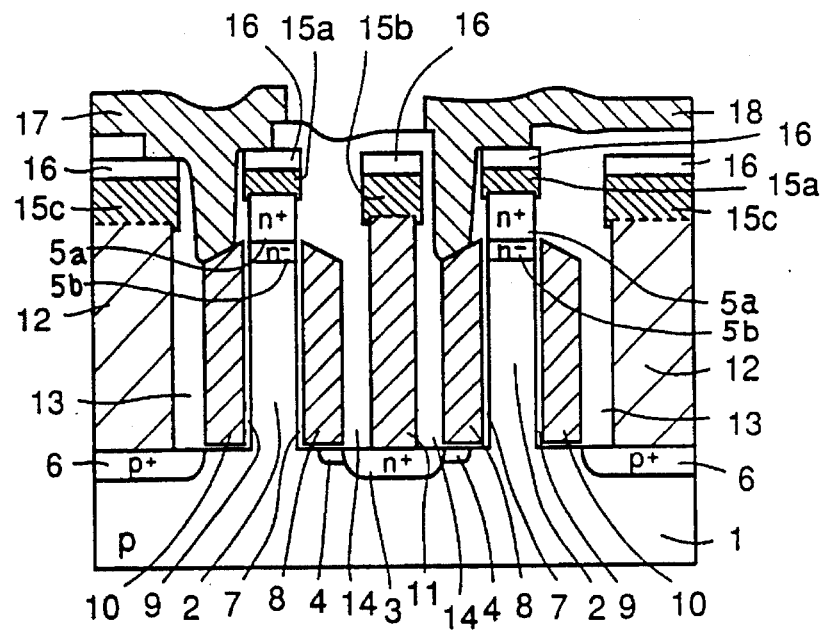

As shown in FIG. 38, resist 53 is formed in a prescribed region on the polycrystalline silicon film 52 by means of a photolithography technique. Using the resist 53 as mask, the polycrystalline silicon film 52 is etched. Thus, as shown in FIG. 39, the interconnection layer 18 connected to the first gate electrode 8, and the interconnection layer 17 connected to the second gate electrode 10 are formed. Thereafter, the resist 53 is removed away.

Figure 40:
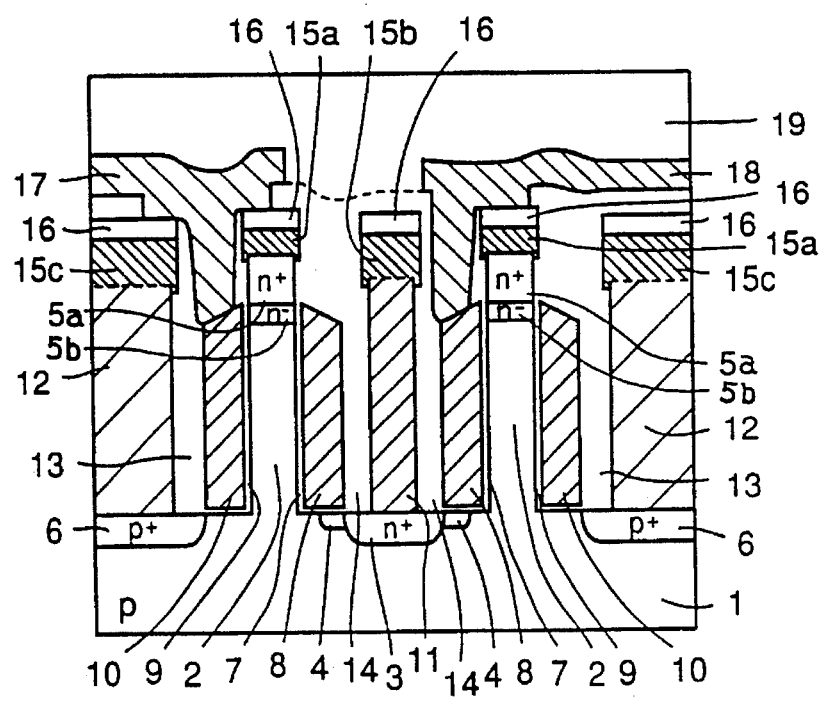

As shown in FIG. 40, the interlayer insulating film 19 of silicon oxide film is formed on the entire surface by means of CVD.

Figure 41:
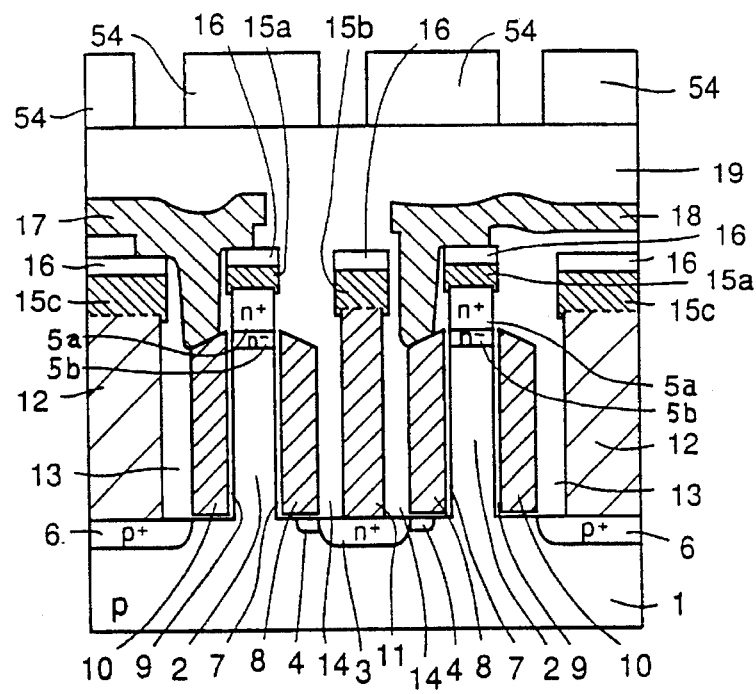
Figure 42:
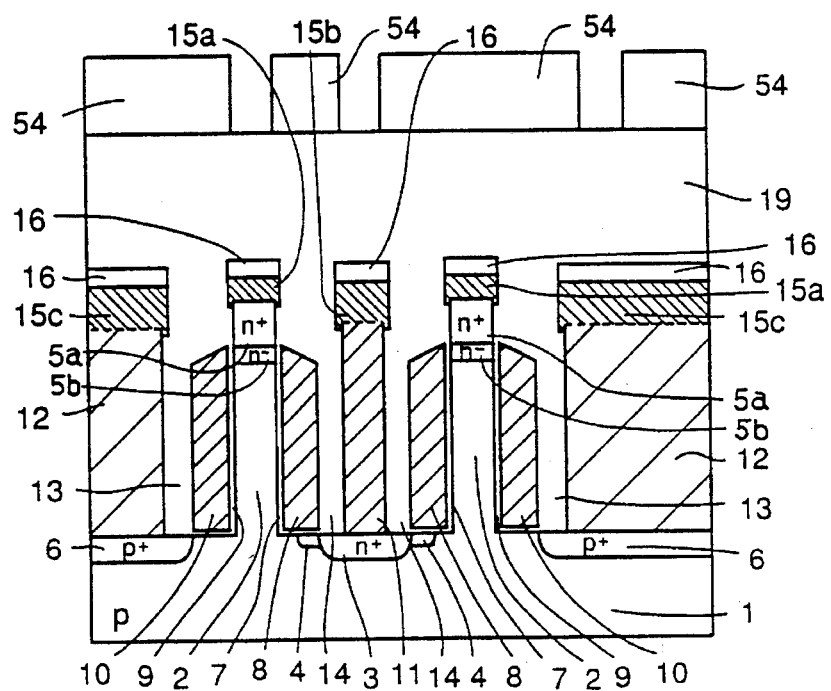

Then, as shown in FIG. 41 (cross section along X—X) and FIG. 42 (cross section along Y—Y), resist 54 having a contact hole pattern in the upper part of the interconnection layers 11 and 12 and in the upper part of the cylindrical portion 2 is formed.

Figure 43:
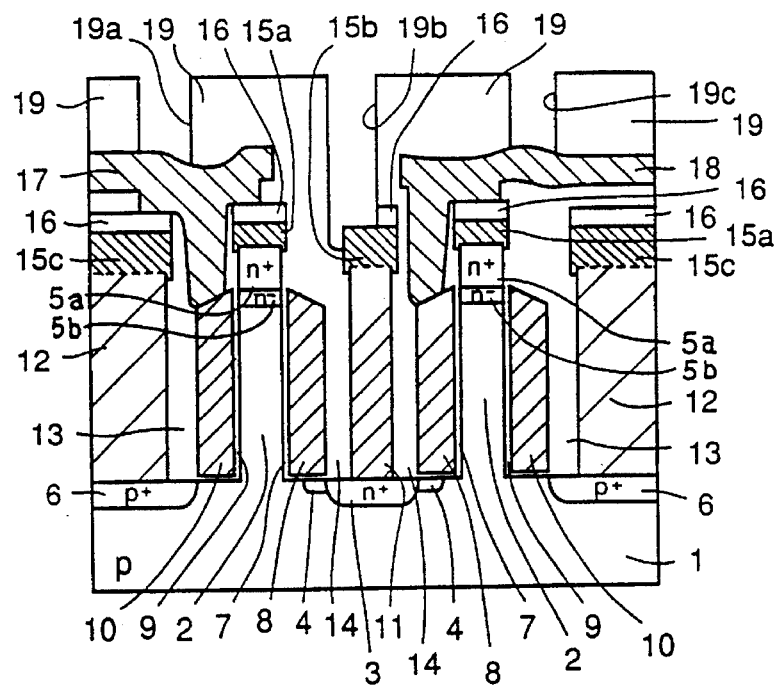
Figure 44:
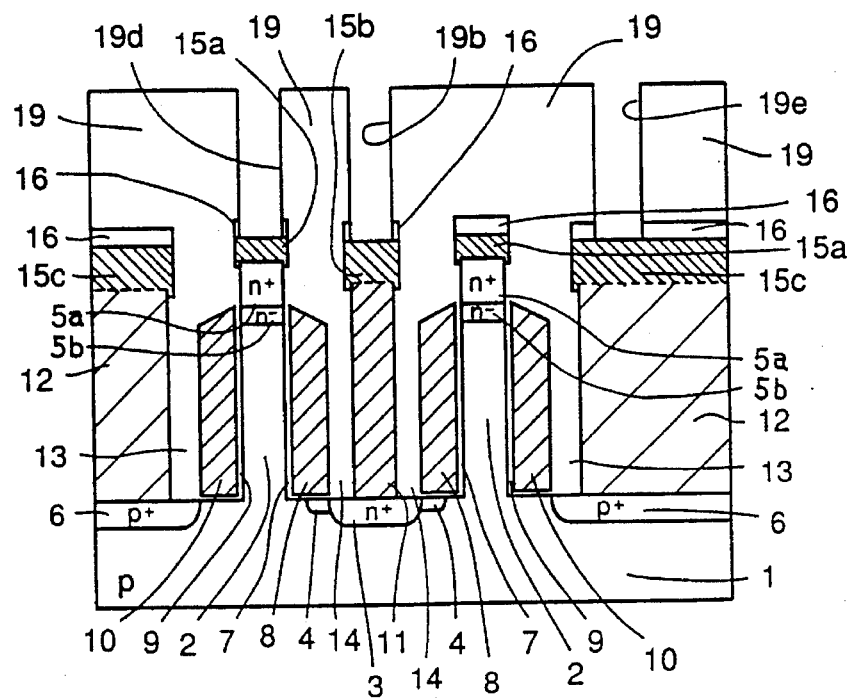
FIG. 44 is a cross sectional view for use in illustration of the 39th step in a manufacturing process of the MIS type field effect transistor of the first embodiment shown in FIG. 3.

Then, as shown in FIG. 43 and 44, using the resist 54 as mask, the interlayer insulating film 19 of silicon oxide film is etched to form the contact holes 19a, 19b, 19c, 19d, and 19e for establishing electrical contacts with the interconnection layer 17, the interconnection layer 11, the interconnection layer 18, the cylindrical portion 2, and the interconnection layer 12, respectively.

Finally, as shown in FIGS. 2 and 3, the interconnection layers 20, 22, 21, 23, and 24 in electrical connection with the interconnection layer 17, the conductive layer 15b, the interconnection layer 18, the source/drain regions 5 and the interconnection layer 12, respectively are formed.

Thus, the vertical type MIS semiconductor device of the first embodiment is completed.

Figure 45:
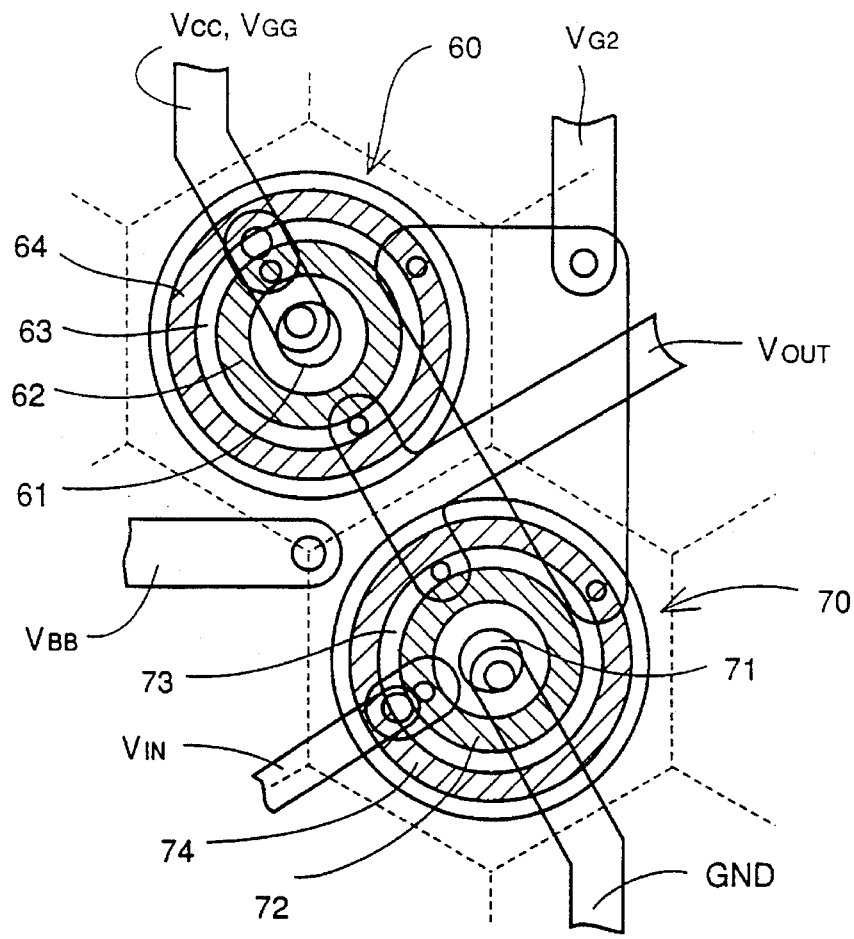
FIG. 45 is a plan view showing an EE type static inverter formed using two vertical type MIS type field effect transistors in accordance with a second embodiment of the invention.
Figure 46:
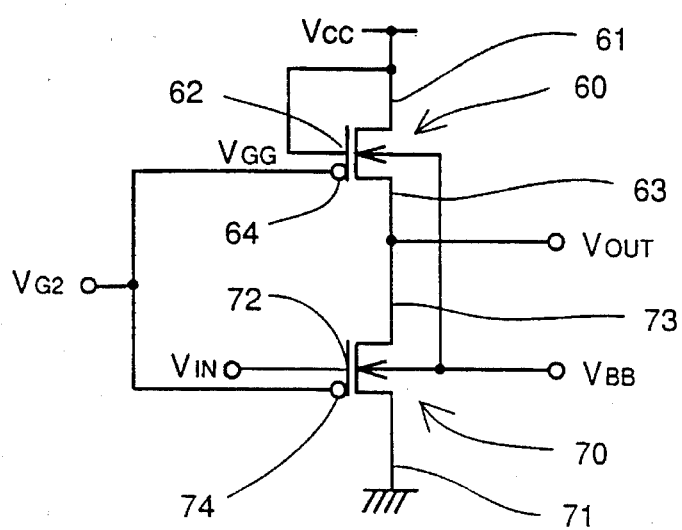
FIG. 46 is an equivalent circuit diagram showing the EE type static inverter in accordance with the second embodiment shown in FIG. 45.

FIG. 45 is a plan view showing arrangement of an EE type static inverter formed using two MIS field effect transistors in accordance with a second embodiment of the invention. FIG. 46 is an equivalent circuit diagram showing the EE type static inverter shown in FIG. 45. Referring to FIGS. 45 and 46, the EE type static inverter in accordance with the second embodiment is formed of a combination of two MIS field effect transistors shown in FIGS. 1–3. More specifically, the EE type static inverter in accordance with the second embodiment includes an N channel MIS field effect transistor 60, and an N channel MIS field effect transistor 70. A source/drain region 63 of the MIS field effect transistor 60 and a source/drain region 73 of the MIS field effect transistor 70 are mutually connected and connected together to an output terminal $V_{out}$. A source/drain region 61 of the MIS field effect transistor 60 is connected to a $V_{CC}$ power supply. The first gate electrode 62 of the MIS field effect transistor 60 is connected to the source/drain region 61. The second gate electrode 64 of the MIS field effect transistor 60 and the second gate electrode (sub gate electrode) of the MIS field effect transistor 70 are mutually connected and connected together to a $V_{G2}$ power supply. A source/drain region 71 of the MIS field effect transistor 70 is grounded, with the first gate electrode 72 being connected to an input power supply $V_{IN}$. The MIS field effect transistors 60 and 70 are supplied with a back gate voltage $V_{BB}$. In the EE type static inverter in accordance with the second embodiment having such a structure, the threshold voltages of the MIS field effect transistors 60 and 70 can readily be controlled by controlling the voltage $V_{G2}$ applied to the second gate electrodes (sub gate electrodes) 64 and 74. This makes it possible to control the threshold voltages depending upon the noise levels of signals, thus providing transistor characteristics suitable for various operation states. The broken line in FIG. 45 represents the boundaries of the regions occupied by the field effect transistors. Thus arranging the MIS field effect transistor in the center of a regular hexagon permits one such MIS field effect transistor to be surrounded by six MIS field effect transistors. More specifically, a so-called "closest packed structure" most suitable for high density integration is provided.

Figure 47:
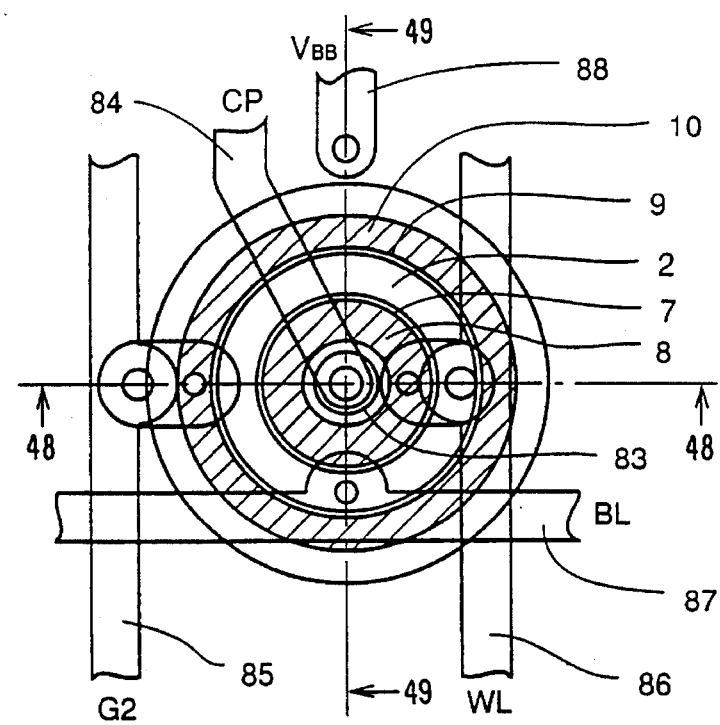
FIG. 47 is a plan view showing a DRAM having a vertical type MIS field effect transistor and a capacitor in accordance with a third embodiment of the invention.
Figure 48:
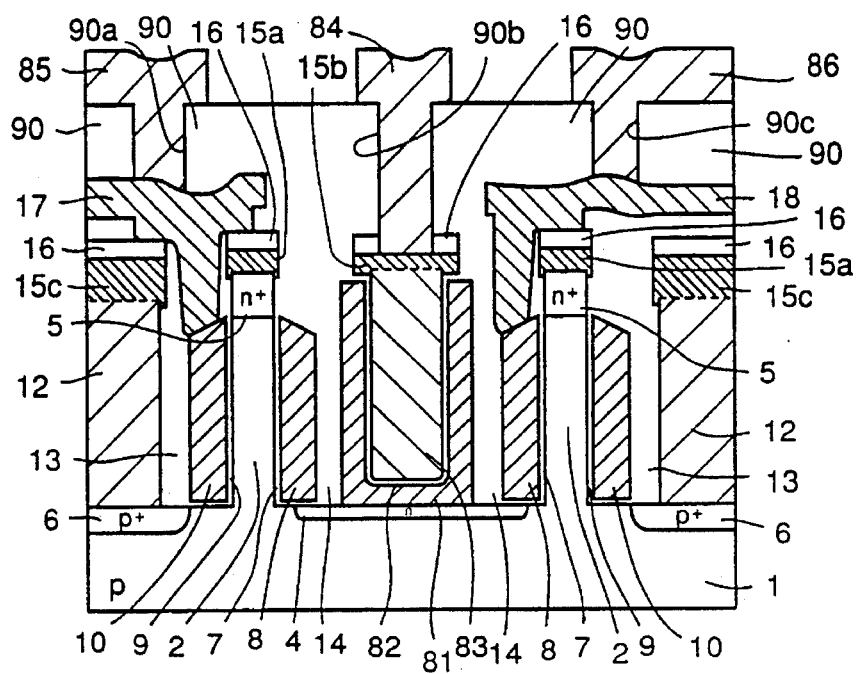
FIG. 48 is a cross sectional view showing the structure of the DRAM in accordance with the third embodiment shown in FIG. 47 taken along line X—X.
Figure 49:
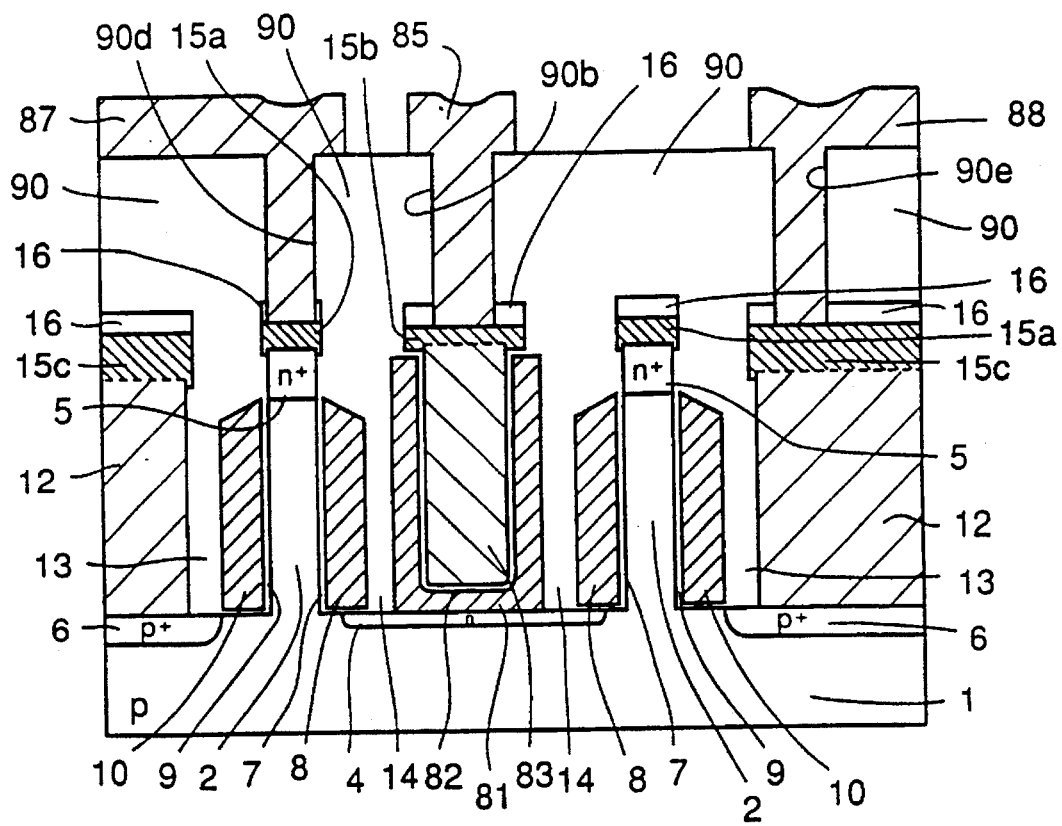
FIG. 49 is a cross sectional view showing the structure of the DRAM in accordance with the third embodiment shown in FIG. 47 taken along line Y—Y.
Figure 50:
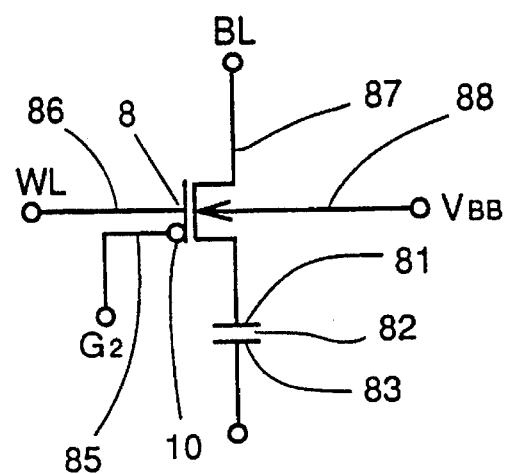
FIG. 50 is an equivalent circuit diagram showing the memory cell portion of the DRAM in accordance with the third embodiment shown in FIG. 47.

FIG. 47 is a plan view showing a memory cell in a DRAM employing a vertical type MIS field effect transistor in accordance with a third embodiment of the invention. FIG. 48 is a cross sectional view showing the DRAM shown in FIG. 47 taken along line X—X. FIG. 49 is a cross sectional view showing the DRAM in FIG. 47 taken along line Y—Y. FIG. 50 is an equivalent circuit diagram showing the memory cell portion of the DRAM shown in FIGS. 47–49.

Referring to FIGS. 47–50, the DRAM in accordance with the third embodiment includes a p type polycrystalline silicon substrate 1, a cylindrical portion 2 formed of polycrystalline silicon and extending from a prescribed region on a main surface of the p type monocrystalline silicon substrate 1 in the direction vertical to the main surface, a first cylindrical gate electrode 8 of polycrystalline silicon formed on the inner surface of the cylindrical portion 2 with a gate oxide film 7 of SiO$_2$ therebetween, a second cylindrical gate electrode (sub gate electrode) 1 formed on the outer surface of the cylindrical portion 2 with a second gate oxide film 9 of SiO$_2$ therebetween, an n type source/drain region of a low impurity concentration formed on the bottom surface portion of the p type monocrystalline silicon substrate 1 surrounded by the inner surface of the cylindrical portion 2, an n type cylindrical source/drain region 5 having a high impurity concentration formed on the top ends of the cylindrical portion 2, a cylindrical capacitor lower electrode (storage node) 81 electrically connected to the source/drain region 4 and formed to extend upwardly, a capacitor upper electrode (cell plate) 83 formed to be buried in the cylindrical inside portion of the storage node 81 with a capacitor insulating film 82 therebetween, a p$^+$ impurity region 6 formed in a prescribed region on a main surface of the p type monocrystalline silicon substrate 1 positioned outside the cylindrical portion 2, an interlayer insulating film 13 of SiO$_2$ formed between the interconnection layer 12 and the second gate electrode 10, an interlayer insulating film 14 of SiO$_2$ formed between the first gate electrode 8 and the storage node 81, conductive layers 15a, 15b, and 15c electrically connected onto the cell plate 83 and the source/drain regions 5, an insulating film 16 of a silicon nitride film formed on the conductive layers 15a, 15b, and 15c, an interconnection layer 18 electrically connected to the first gate electrode 8, an interconnection layer 17 electrically connected to the second gate electrode 10, an interlayer insulating film 90 of SiO$_2$ formed to cover the entire surface and having contact holes 90a, 90b, 90c, 90d, 90e in the interconnection layer 17, the conductive layer 15b, the interconnection layer 18, the conductive layer 15a and the conductive layer 15c, respectively, a metal interconnection layer 85 electrically connected to the interconnection layer 17 in the contact hole 90a, a metal interconnection layer 84 electrically connected to the cell plate 83 through the conductive layer 15b in the contact hole 90b, a word line 86 electrically connected to the interconnection layer 18 in the contact hole 90c (see FIG. 49), a bit line 87 electrically connected to the conductive layer 15a in the contact hole 90d (see FIG. 49), and a metal interconnection layer 88 electrically connected to the interconnection layer 12 in the contact hole 90e through the conductive layer 15c.

The storage node 81, the capacitor insulating film 82, and the cell plate 83 constitute a stacked type capacitor for storing charge corresponding to a data signal. The source/drain regions 4, the source/drain regions 5, the cylindrical portion 2, the first gate electrode 8, and the second gate electrode 10 constitute a memory cell transistor. Also in the DRAM in accordance with the third embodiment, as with the first embodiment illustrated in FIG. 1, controlling voltage applied to the first gate electrode 8 and the second gate electrode 10 permits the threshold voltage of the memory cell transistor to be easily controlled. Since the memory cell transistor herein has a function of conducting a switching operation for holding data storage, its threshold voltage must be set higher than those of transistors in peripheral circuitry (not shown). If, for example, the threshold voltage of a field effect transistor in a peripheral circuit is 0.6 V, the threshold voltage of the memory cell transistor is preferably about 0.8 V. In this embodiment, the threshold voltage of the memory cell transistor can readily be controlled to be 0.8 V using the first gate electrode 8 and the second gate electrode (sub gate electrode) 10. More specifically, if the second gate electrode 10 is fixed to 0 V, the threshold voltage becomes 0.6 V. If the second gate electrode 10 is fixed to a −0.4 V level, the threshold voltage of the memory cell transistor becomes 0.8 V. In other words, a negative voltage (−0.4 V) twice the amount to be increased from the threshold voltage (0.2 V) is applied to the second gate electrode 10. This makes it possible to readily set the threshold voltage of the memory cell transistor higher than that of the threshold voltage of the transistor of the peripheral circuit. Thus, the memory cell transistor having the threshold voltage suitable for a data memory holding portion can be provided. In the equivalent circuit diagram in FIG. 50, a metal interconnection layer 88 is for providing the back gate voltage $V_{BB}$ to the $p^+$ impurity region 6.

Figure 51:
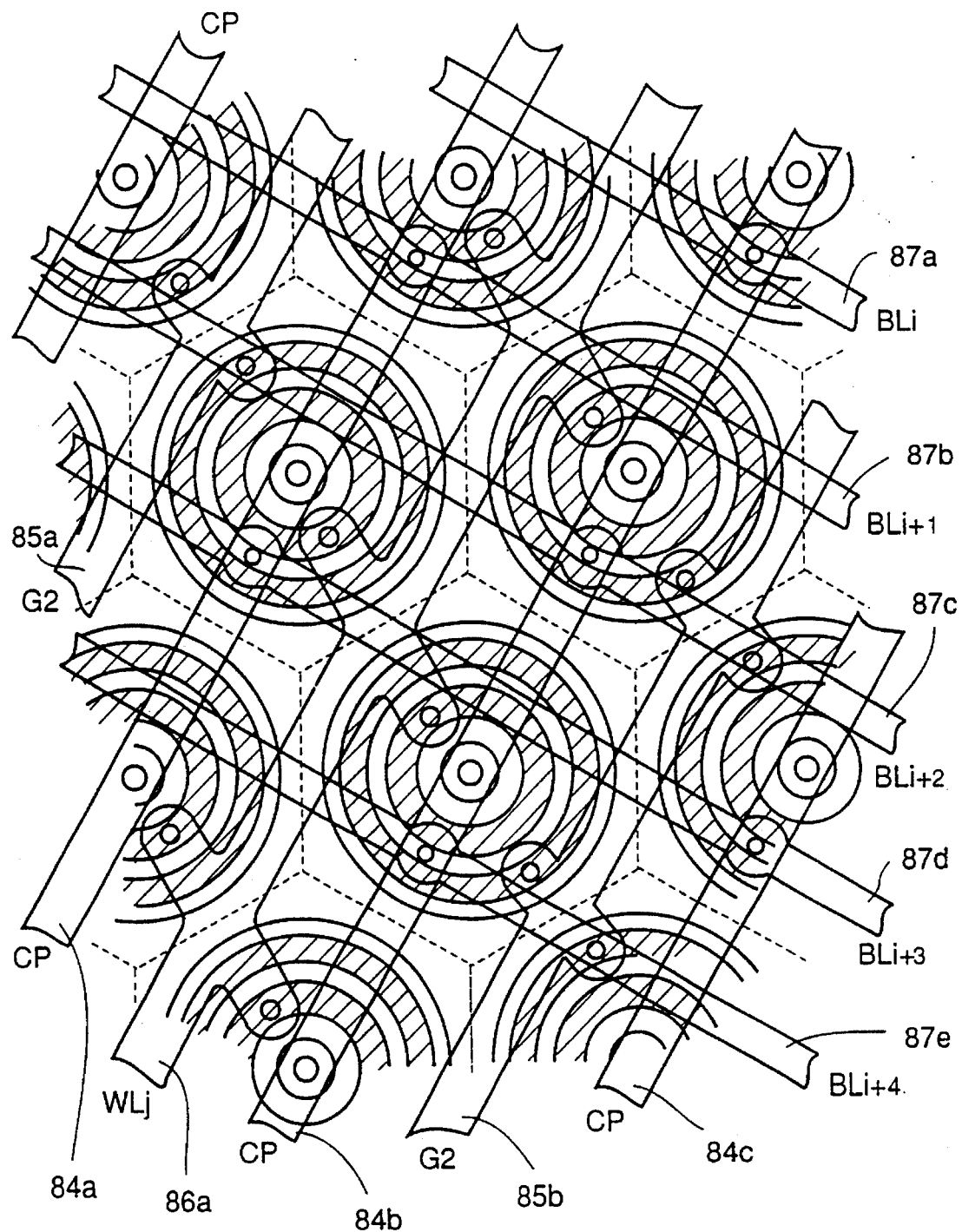
FIG. 51 is a plan view showing arrangement of a plurality of the memory cells constituting the DRAM in accordance with the third embodiment shown in FIG. 47.

FIG. 51 is a plan view showing arrangement of a plurality of the one memory cell shown in FIG. 47 in practice. Referring to FIG. 51, a bit line 87a represents the i-th bit line, while a word line 86a represents the j-th word line. Interconnection layers 84a, 84b, and 84c represent interconnection layers to the cell plates, while interconnection layers 85a and 85b represent interconnection layers to the second gate electrodes (sub gate electrodes). The dotted line in the figure represents the boundaries between the regions occupied by the memory cells. As described above, arranging one memory cell in the center of a rectangular hexagon provides arrangement of one memory cell surrounded by six memory cells. Consequently, the memory cell group attains the "closest packed structure" allowing maximum improvement of integration density.

FIGS. 52–63 are cross sectional views for use in illustration of a manufacturing process of the DRAM in accordance with the third embodiment shown in FIGS. 47–50. Referring to FIGS. 47–49 and FIGS. 52–63, the manufacturing process of the DRAM in accordance with the third embodiment will be described.

Figure 52:
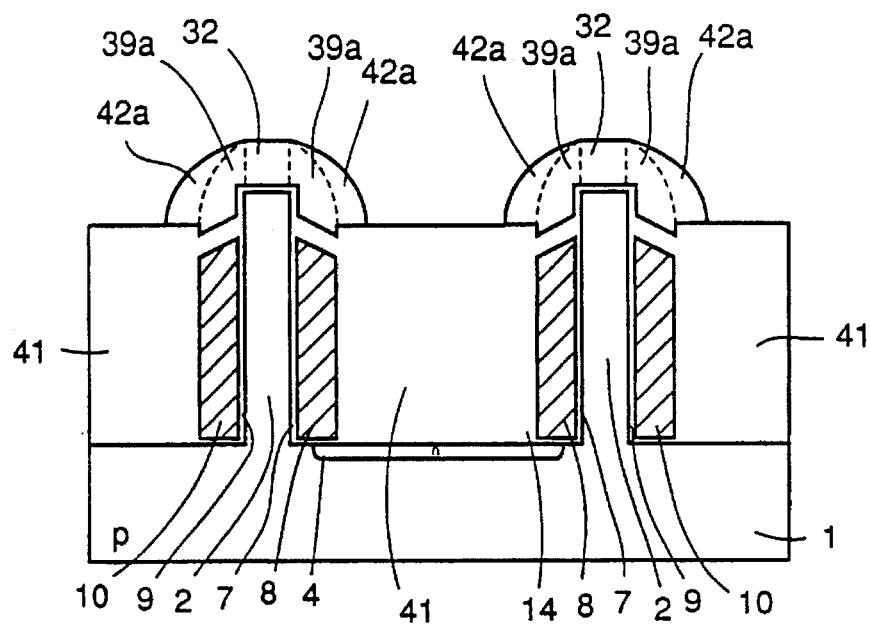
FIGS. 52–62 are cross sectional views for use in illustration of steps (18th–28th) in a manufacturing process of the DRAM in accordance with the third embodiment shown in FIG. 48.

In the same process as the MIS semiconductor device in accordance with the first embodiment shown in FIGS. 4 to 21, a structure shown in FIG. 52 is formed. More specifically, a structure corresponding to FIG. 21 is the structure given in FIG. 52.

Figure 53:
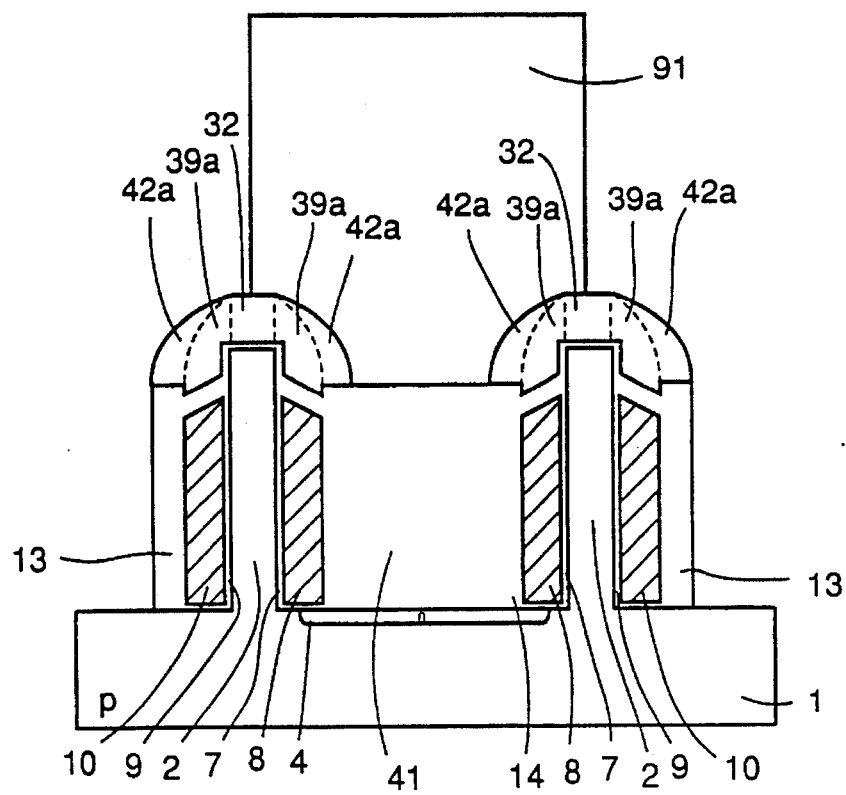

As shown in FIG. 53, resist 91 to cover the inside of the cylindrical portion 2 is formed. Using the resist 91, a silicon nitride film 32, and sidewalls 39a and 42a of silicon nitride films as mask, a silicon oxide film 41 positioned outside the cylindrical portion (see FIG. 52) is etched. An interlayer insulating film 13 is thus formed in the outer surface of a cylindrical second gate electrode 10. Thereafter, the resist 91 is removed away.

Figure 54:
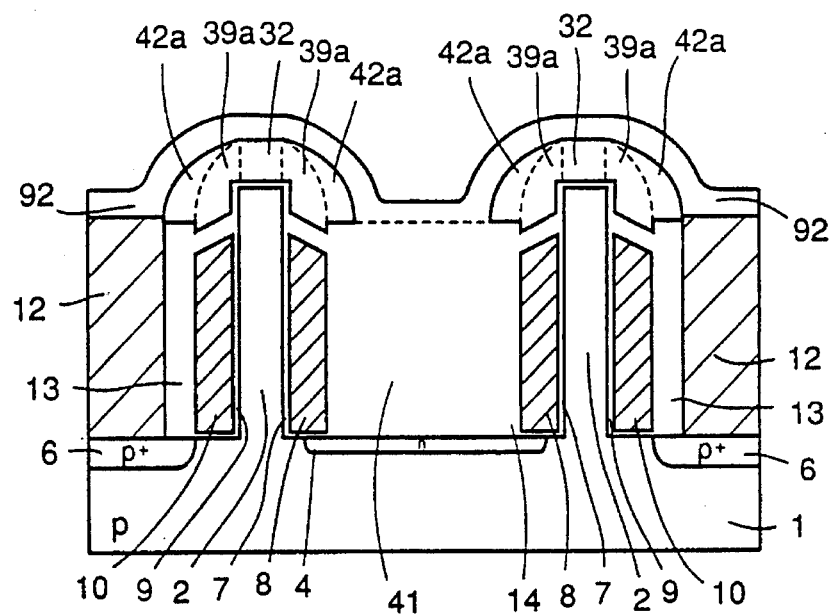

As shown in FIG. 54, using the silicon oxide film 41, the silicon nitride film 32, the sidewalls 39a and 42a of silicon nitride films as mask, p type impurity ions are implanted into a p type monocrystalline silicon substrate 1. Thus, the potential of the substrate is fixed and a $p^+$ impurity region 6 having a function of isolating elements is formed. A polycrystalline silicon film (not shown) is formed on the entire surface as to the extent the outside of the cylindrical portion 2 is buried by means of CVD. After planarizing the polycrystalline silicon film, the polycrystalline silicon film is etched back until the silicon nitride film 32, and the sidewalls 39a and 42a are exposed, and the polycrystalline silicon film inside the cylindrical portion 2 is completely removed away. Thus, an interconnection layer 12 to the $p^+$ impurity region 6 for fixing the potential of the substrate is formed. Thereafter, a silicon oxide film 92 is formed on the entire surface by means of chemical vapor deposition.

Figure 55:
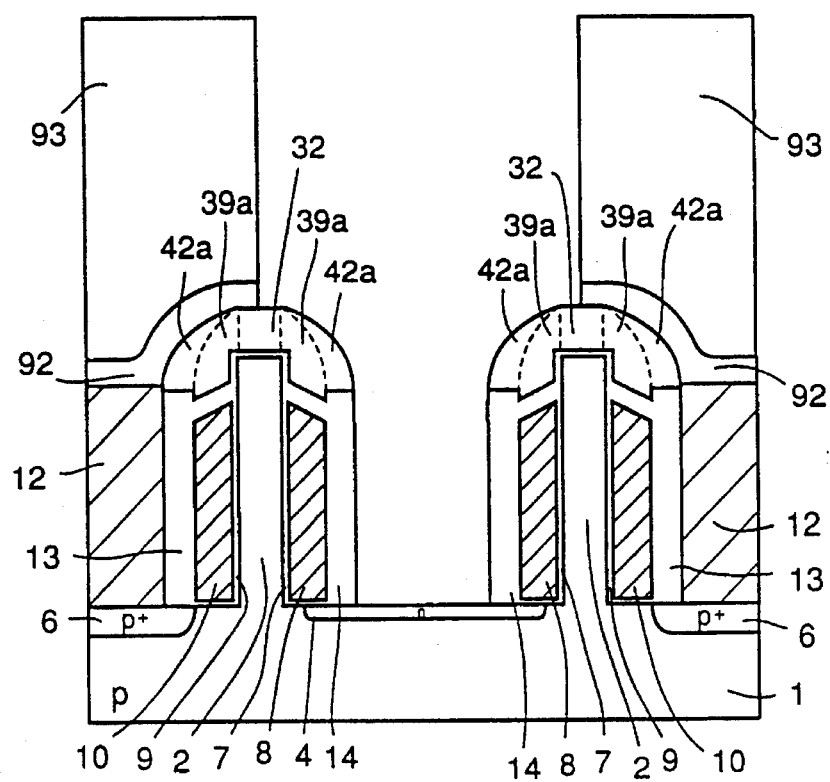

As shown in FIG. 55, resist 93 covering the outside of the cylindrical portion 2 is formed by means of a photolithography technique. Using the resist 93, the silicon nitride film 32, and the sidewalls 39a and 42a of silicon nitride films as mask, the silicon oxide films 91 and 41 (see FIG. 54) inside the cylindrical portion 2 are etched away. Thus, an interlayer insulating film 14 covering the inner surface of the cylindrical first gate electrode 8 is formed. Thereafter, the resist 93 is removed away.

Figure 56:
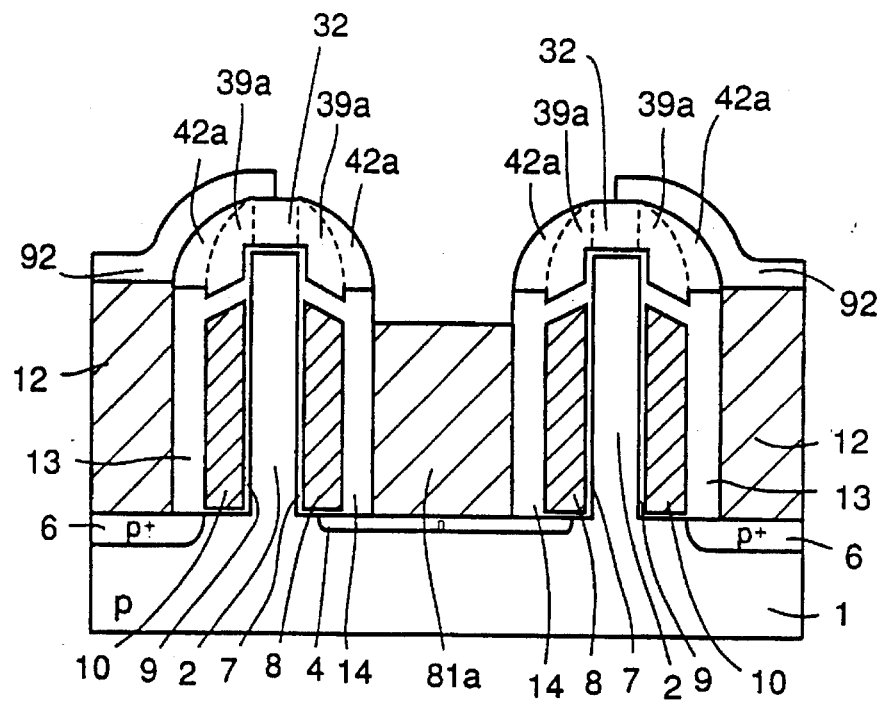

Then, as shown in FIG. 56, after a polycrystalline silicon film (not shown) is deposited on the entire surface by means of CVD, the surface of the polycrystalline silicon film is planarized. Then, the polycrystalline silicon film is etched back until the upper part of the cylindrical portion 2 is exposed. Thus, a polycrystalline silicon film 81a is formed.

Figure 57:
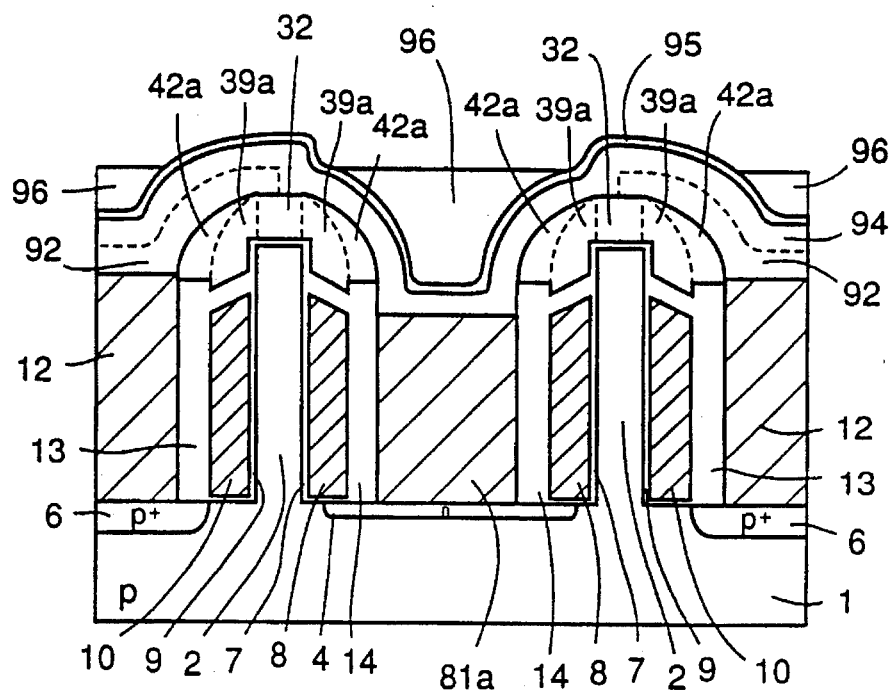

As shown in FIG. 57, a silicon oxide film 94 is formed on the entire surface by means of chemical vapor deposition. A silicon nitride film 95 is formed on the silicon oxide film 94. After forming a silicon oxide film 96 on the silicon nitride film 95, the surface is planarized. Thus, the silicon nitride film 95 positioned in the upper part of the cylindrical portion 2 is exposed.

Figure 58:
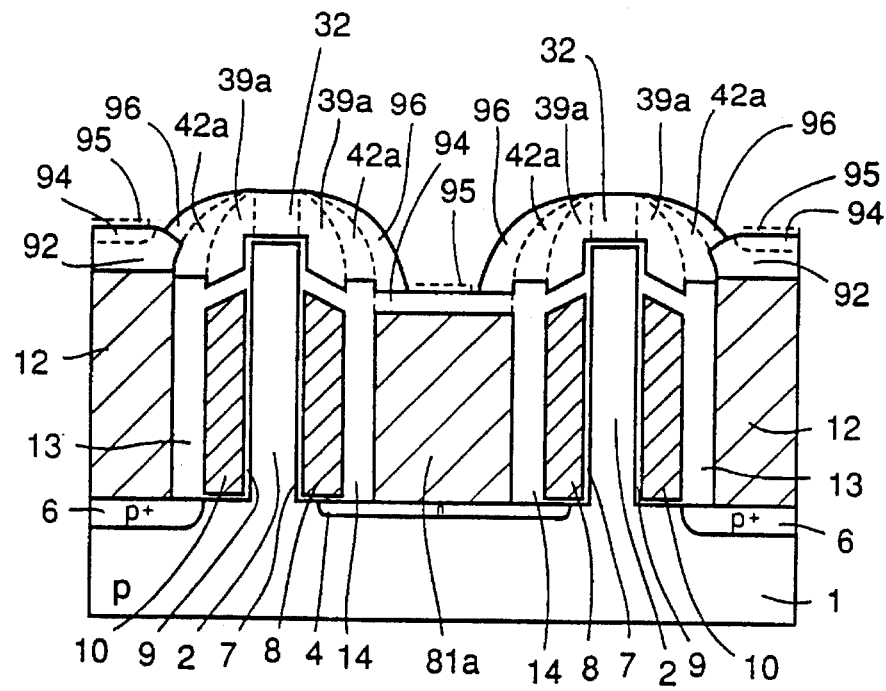

As shown in FIG. 58, the silicon nitride film 95 positioned in the upper part of the cylindrical portion 2 is removed away by a chemical treatment. The entire silicon oxide film 96, and the silicon oxide films 92 and 94 positioned in the upper part and the sidewall of the cylindrical portion 2 are etched away.

Figure 59:
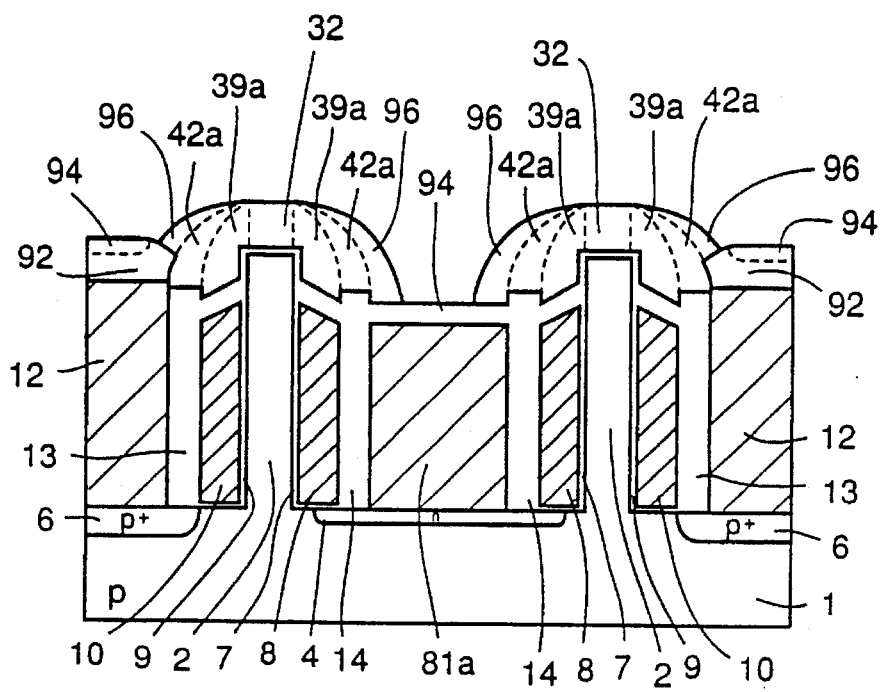

As shown in FIG. 59, after depositing a silicon nitride film (not shown) on the entire surface, a sidewall 96 of a silicon nitride film is formed on the sidewall portion of the sidewall 42a of silicon nitride film, by conducting an anisotropic etching.

Figure 60:
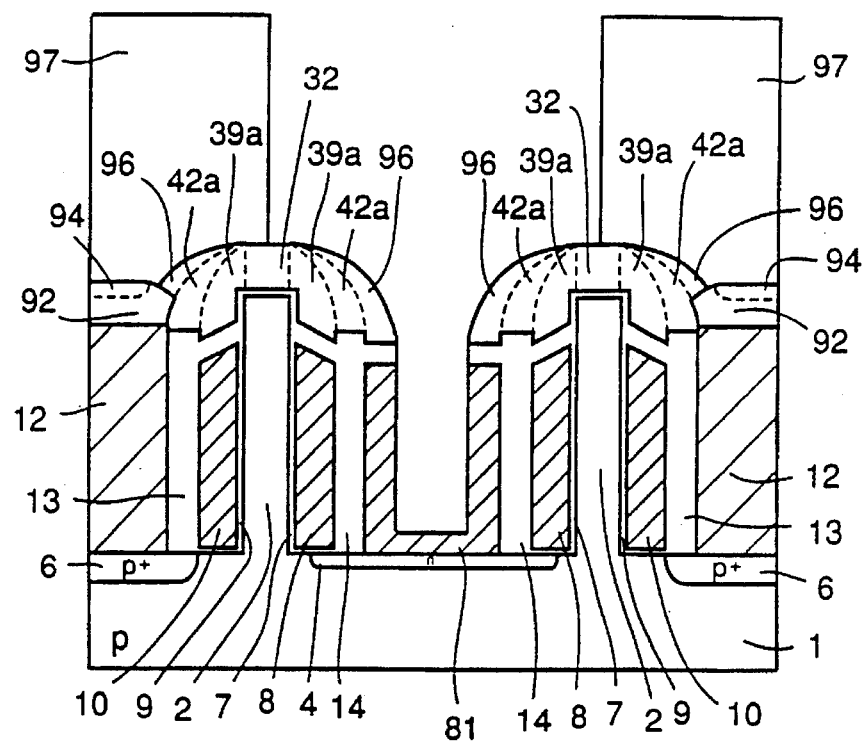

As shown in FIG. 60, resist 97 covering the outside of the cylindrical portion 2 is formed by means of a photolithography technique. Using the resist 97, the silicon nitride film 32, and the sidewalls 39a, 42a, and 96 of silicon nitride film as mask, the silicon oxide film 94 and the polycrystalline silicon film 81a (see FIG. 59) are etched. Thus, a cylindrical storage node 81 constituting a capacitor lower electrode is formed. Then, the resist 97 is removed away.

Figure 61:
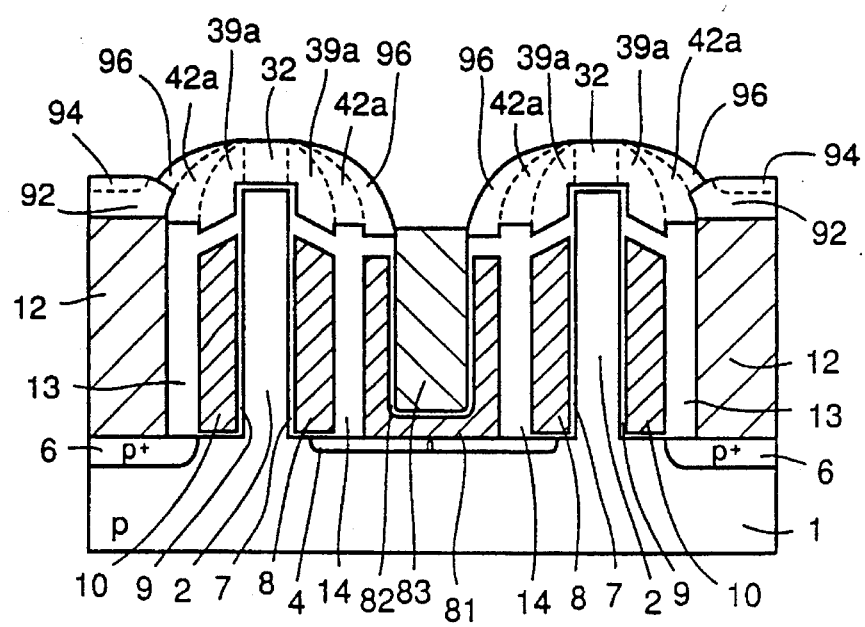
Figure 62:
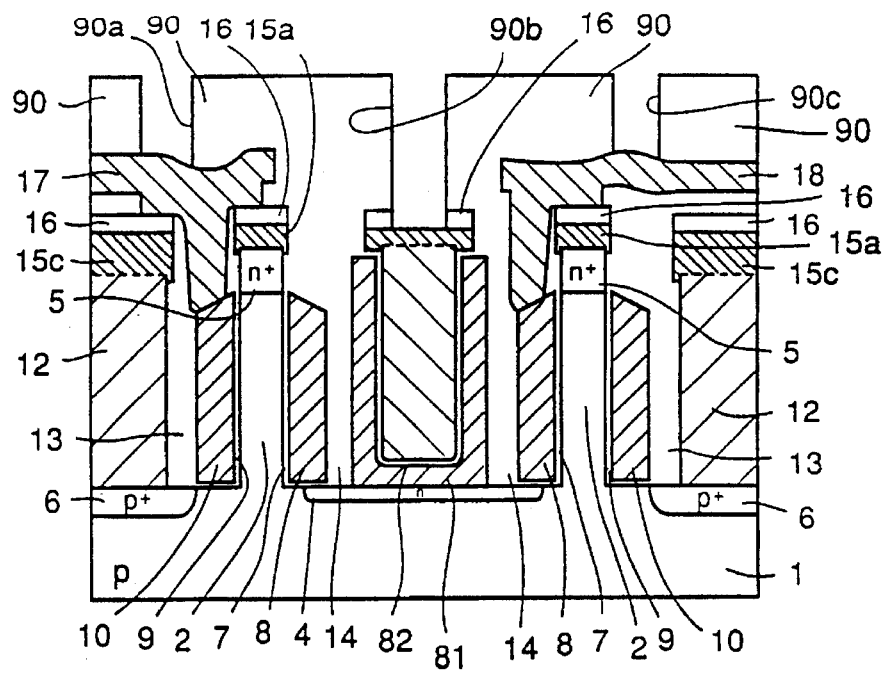
Figure 63:
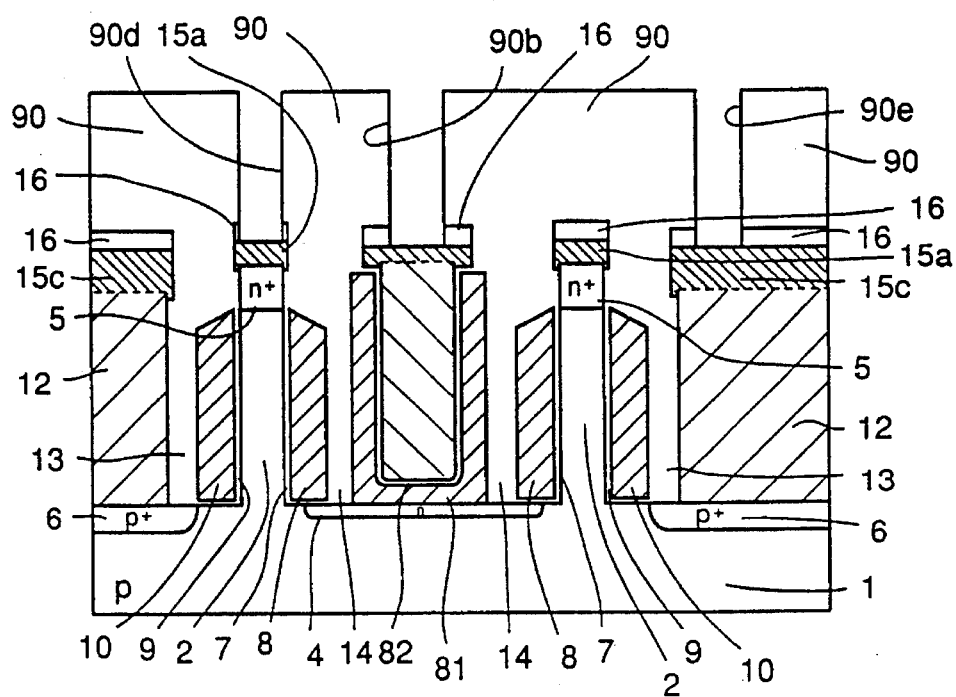
FIG. 63 is a cross sectional view showing the 28th step in a manufacturing process of the DRAM in accordance with the third embodiment shown in FIG. 49.
Figure 64:
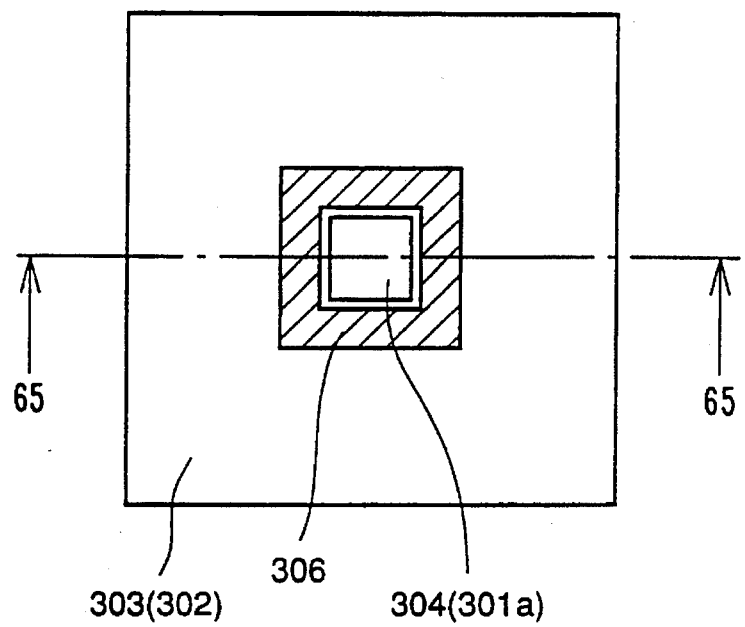
FIG. 64 is a plan view showing a conventional SGT as an example of a vertical type MIS semiconductor device.
Figure 65:
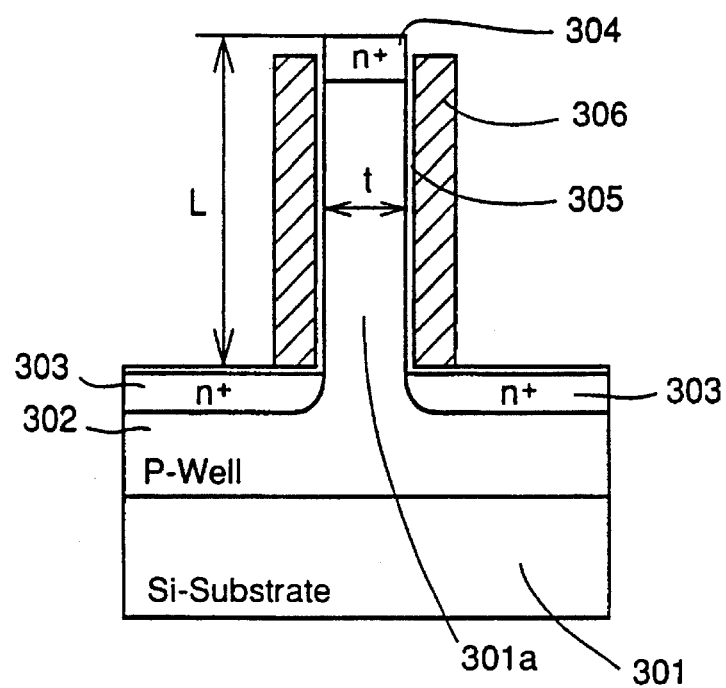
FIG. 65 is a cross sectional view showing the structure of the conventional SGT shown in FIG. 64 taken along line X—X.

As shown in FIG. 61, a capacitor insulating film 82 is formed on the inner surface of the storage node 81. A polycrystalline silicon film (not shown) is formed on the entire surface by CVD, and then the surface of the polycrystalline silicon film is planarized. The polycrystalline silicon film is etched until the upper part of the cylindrical portion 2 is exposed. Thus, a cell plate 83 constituting a capacitor upper electrode is formed. Thereafter, the silicon oxide films 92 and 94 are removed away by a chemical treatment. The manufacturing process after that is the same as the manufacturing process of the first embodiment shown in FIGS. 26–44. The structure corresponding to FIGS. 43 and 44 according to the first embodiment is a structure shown in FIGS. 62 and 63. Thus, the memory cell portion of the DRAM in accordance with the third embodiment is completed.

As in the foregoing, according to the semiconductor device in one aspect of the invention, since a standing wall portion having inner and outer surfaces and extending in a tubular manner is formed in a semiconductor substrate, a first tubular gate electrode is formed on the inner surface of the standing wall portion with a first gate insulating film therebetween, and a second tubular gate electrode is formed on the outer surface of the standing wall portion with a second gate insulating film therebetween, the threshold voltage of the transistor can easily be controlled without requiring change of the materials for the gate electrodes. As first source/drain regions of second type conductivity are formed on the top ends of the standing wall portion, and a second source/drain region of the second type conductivity is formed on the bottom surface of the semiconductor substrate surrounded by the inner surface of the standing wall portion, and the side portion of the standing wall portion can be utilized as a channel region as well as area occupied by the elements can be reduced as compared to conventional planar type (plane type) transistors. Consequently, a semiconductor device suitable for high density integration can be provided.

Furthermore, according to a semiconductor device in another aspect of the invention, since a standing wall portion having inner and outer surfaces and extending in a tubular manner is formed in a semiconductor substrate, a first gate electrode is formed on the inner surface of the standing wall portion with a first gate insulating film therebetween, a second gate electrode is formed on the outer surface of the standing wall portion with a second gate insulating film therebetween, first source/drain regions of second type conductivity are formed on the top ends of the standing wall portion, a second source/drain region of the second type conductivity is formed on the bottom surface of the semiconductor substrate surrounded by the inner surface of the standing wall portion, a capacitor lower electrode electrically connected to the second source/drain region is formed, and a capacitor upper electrode is formed on the capacitor lower electrode with a capacitor insulating film therebetween, the threshold voltage of the transistor can easily be controlled by voltage applied to the second gate electrode. Also, the side surface of the standing wall portion can also be used for the channel region of the transistor, area occupied by the elements can reduced as compared to conventional planar type transistors, thus allowing high density integration. Furthermore, since the capacitor formed of the capacitor lower electrode, the capacitor insulating film, and the capacitor upper electrode is connected to the second source/drain region of such a transistor, threshold voltage of the memory cell transistor can easily be controlled at a threshold voltage level suitable for holding the data of the capacitor, and a memory cell suitable for high density integration can be provided.

According to a method of manufacturing the semiconductor device in one aspect of the invention, since a standing wall portion having inner and outer surfaces and extending in a tubular manner is formed in a main surface of a semiconductor substrate of first type conductivity, a first tubular gate electrode is formed on the inner surface of the standing wall portion with a first gate insulating film therebetween, a second tubular gate electrode is formed on the outer surface of the standing wall portion with a second gate insulating film therebetween, first source/drain regions are formed by implanting an impurity of second type conductivity into the top end portions of the standing wall portion, and an impurity of the second type conductivity is implanted into the bottom surface of the semiconductor substrate surrounded by the inner surface of the standing wall portion to form a second source/drain region, the threshold voltage of the transistor can easily be controlled using the first gate electrode and the second gate electrode, a semiconductor device which utilizes the side surface of the standing wall portion as a channel region and suitable for high density integration can be manufactured.

According to a method of manufacturing a semiconductor device in accordance with another aspect of the invention, since a standing wall portion having inner and outer surfaces and extending in a tubular manner is formed on a main surface of a semiconductor substrate of first type conductivity, a first tubular gate electrode is formed on the inner surface of the standing wall portion with a first gate insulating film therebetween, a second tubular gate electrode is formed on the outer surface of the standing wall portion with a second gate insulating film therebetween, a first source/drain region is formed by implanting an impurity of second type conductivity to the top end of the standing wall portion, a second source/drain region is formed by implanting an impurity of the second type conductivity into the bottom surface of the semiconductor substrate surrounded by the inner surface of the standing wall portion, a capacitor lower electrode is formed to be electrically connected to the second source/drain region, and a capacitor upper electrode is formed on the capacitor lower electrode with a capacitor insulating film therebetween, the threshold voltage of the transistor can readily be controlled by the first gate electrode and the second gate electrode, and a semiconductor device which utilizes the side surface of the standing wall portion as the channel region of the transistor and suitable for high density integration can be provided. Furthermore, combining such a transistor and such a capacitor provides a semiconductor device having memory cells suitable for high density integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a standing wall portion having inner and outer surfaces and extending in a tubular manner on a main surface of a semiconductor substrate of first type conductivity;

forming a first tubular gate electrode on the inner surface of said standing wall portion with a first gate insulating film therebetween;

forming a second tubular gate electrode on the outer surface of said standing wall portion with a second gate insulating film therebetween;

forming a first source/drain region by implanting a first impurity of second type conductivity to the top end of said standing wall portion; and forming a second source/drain region by implanting a second impurity of the second type conductivity to the bottom surface of said semiconductor substrate surrounded by the inner surface of said standing wall portion.

2. A method of manufacturing a semiconductor device as recited in claim 1, wherein said step of forming the standing wall portion includes a step of forming a cylindrical standing wall portion extending from the main surface of said semiconductor substrate in a direction approximately vertical to the main surface of said semiconductor substrate.

3. A method of manufacturing a semiconductor device, comprising the steps of:

forming a standing wall portion having inner and outer surfaces and extending in a tubular manner on a main surface of a semiconductor substrate of first type conductivity;

forming a first tubular gate electrode on the inner surface of said standing wall portion with a first gate insulating film therebetween;

forming a second tubular gate electrode on the outer surface of said standing wall portion with a second gate insulating film therebetween;

forming a first source/drain region by implanting a first impurity of second type conductivity to the top end of said standing wall portion;

forming a second source/drain region by implanting a second impurity of the second type conductivity to the bottom surface of said semiconductor substrate surrounded by the inner surface of said standing wall portion;

forming a capacitor lower electrode to be electrically connected to said second source/drain region; and forming a capacitor upper electrode on said capacitor lower electrode with a capacitor insulating film therebetween.

4. A method of manufacturing a semiconductor device as recited in claim 3, wherein said step of forming the capacitor lower electrode includes a step of forming a tubular capacitor lower electrode extending in a direction approximately vertical to the main surface of said semiconductor substrate.

* * * * *